US012604487B2

(12) United States Patent
Tai et al.

(10) Patent No.: US 12,604,487 B2
(45) Date of Patent: Apr. 14, 2026

(54) SEMICONDUCTOR STRUCTURE HAVING DEEP TRENCH CAPACITOR AND METHOD OF MANUFACTURING THEREOF

(71) Applicant: TAIWAN SEMICONDUCTOR MANUFACTURING COMPANY LTD., Hsinchu (TW)

(72) Inventors: Chih-Hsuan Tai, Taipei City (TW); Hsiang-Tai Lu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 534 days.

(21) Appl. No.: 18/154,875

(22) Filed: Jan. 16, 2023

(65) Prior Publication Data

US 2024/0170584 A1 May 23, 2024

Related U.S. Application Data

(60) Provisional application No. 63/384,229, filed on Nov. 18, 2022.

(51) Int. Cl.
| | |
|---|---|
| *H10D 1/66* | (2025.01) |
| *H01L 23/522* | (2006.01) |
| *H10D 1/00* | (2025.01) |
| *H10D 62/10* | (2025.01) |
| *H10D 64/01* | (2025.01) |
| *H10D 64/20* | (2025.01) |

(52) U.S. Cl.
CPC ......... *H10D 1/665* (2025.01); *H01L 23/5226* (2013.01); *H10D 1/047* (2025.01); *H10D 62/115* (2025.01); *H10D 64/01* (2025.01); *H10D 64/20* (2025.01)

(58) Field of Classification Search
CPC ........ H10D 1/716; H10D 1/665; H10D 1/047; H10D 64/20; H10D 1/711
See application file for complete search history.

(56) References Cited

U.S. PATENT DOCUMENTS

2021/0057469 A1* 2/2021 Huang .................. H10D 1/043

* cited by examiner

*Primary Examiner* — Wasiul Haider
(74) *Attorney, Agent, or Firm* — WPAT LAW; Anthony King

(57) ABSTRACT

A semiconductor structure includes a substrate including a recess indented into the substrate, a capacitor structure at least partially disposed within the recess, and an interconnect structure disposed over and electrically connected to the capacitor structure. The capacitor structure includes a first electrode layer, a second electrode layer over the first electrode layer, and a first dielectric between the first electrode layer and the second electrode layer. The first electrode layer includes a first body portion disposed in and conformal to the recess and a first extending portion disposed on the substrate, and the second electrode layer covers the first dielectric, the first body portion and the first extending portion of the first electrode layer.

20 Claims, 22 Drawing Sheets

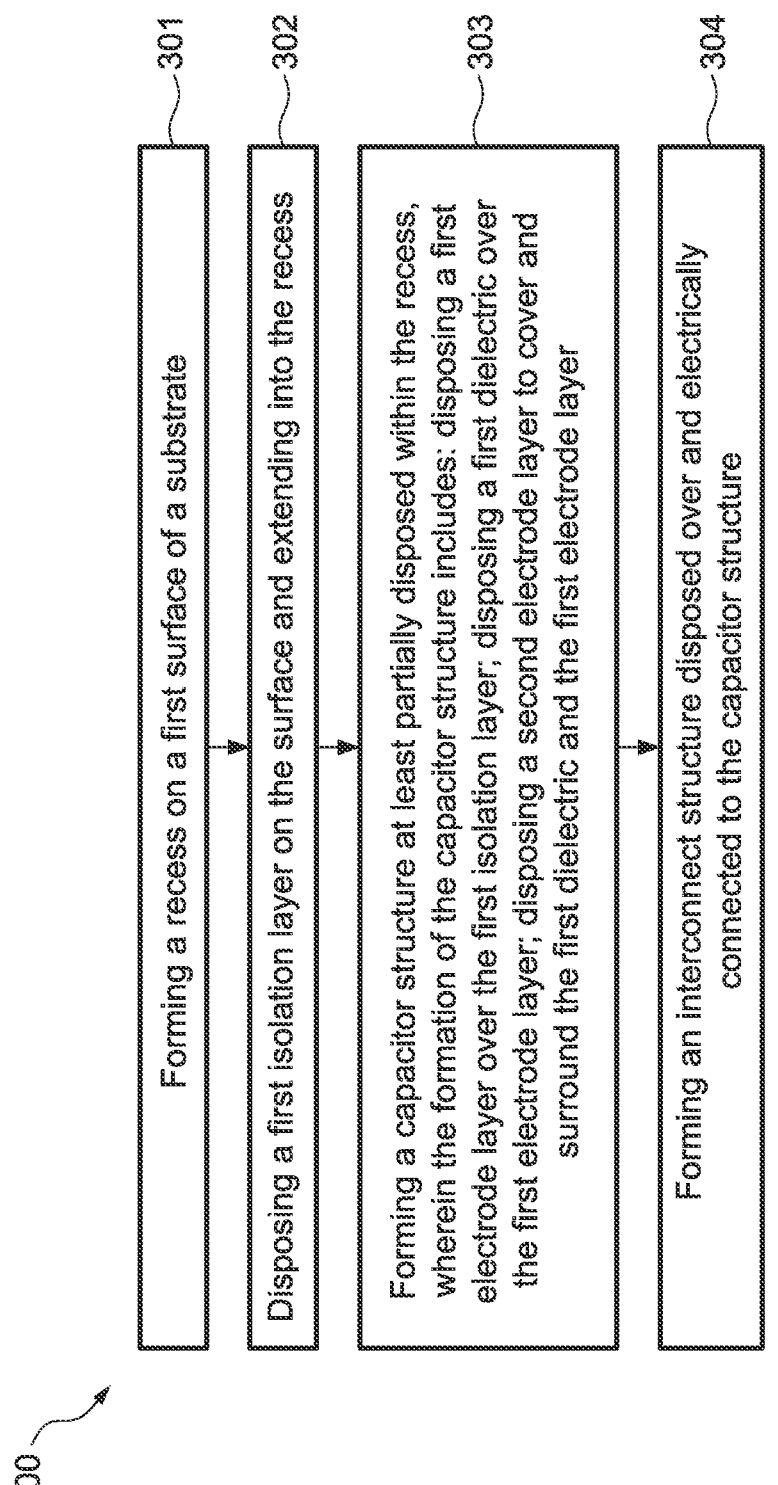

301

Forming a recess on a first surface of a substrate

302

Disposing a first isolation layer on the surface and extending into the recess

303

Forming a capacitor structure at least partially disposed within the recess, wherein the formation of the capacitor structure includes: disposing a first electrode layer over the first isolation layer; disposing a first dielectric over the first electrode layer; disposing a second electrode layer to cover and surround the first dielectric and the first electrode layer

304

Forming an interconnect structure disposed over and electrically connected to the capacitor structure

SEMICONDUCTOR STRUCTURE HAVING DEEP TRENCH CAPACITOR AND METHOD OF MANUFACTURING THEREOF

PRIORITY CLAIM AND CROSS-REFERENCE

This application claims the benefit of prior-filed provisional application No. 63/384,229, filed on 18 Nov. 2022.

BACKGROUND

The semiconductor industry has experienced rapid growth due to ongoing improvements in integration density of a variety of electrical components. To accommodate the miniaturized scale of semiconductor devices, various technologies and applications have been developed for wafer-level packaging, involving greater numbers of different components with different functions. Improvements in integration density have resulted from iterative reduction of minimum feature size, allowing more components to be integrated into a given area. Such advances require the semiconductor devices to undergo ever-greater numbers of manufacturing processes.

As semiconductor technologies further advance, embedding of electrical components into a semiconductive substrate has emerged as an effective approach to further reducing a physical size of a semiconductor device. The electrical component is at least partially embedded within the semiconductive substrate in order to minimize an amount of space occupied above the semiconductive substrate. Such embedding processes utilize sophisticated techniques, and improvements are desired.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 15 is a flow diagram of a method of manufacturing a semiconductor structure in accordance with some embodiments of the present disclosure.

DETAILED DESCRIPTION

Figure 1:
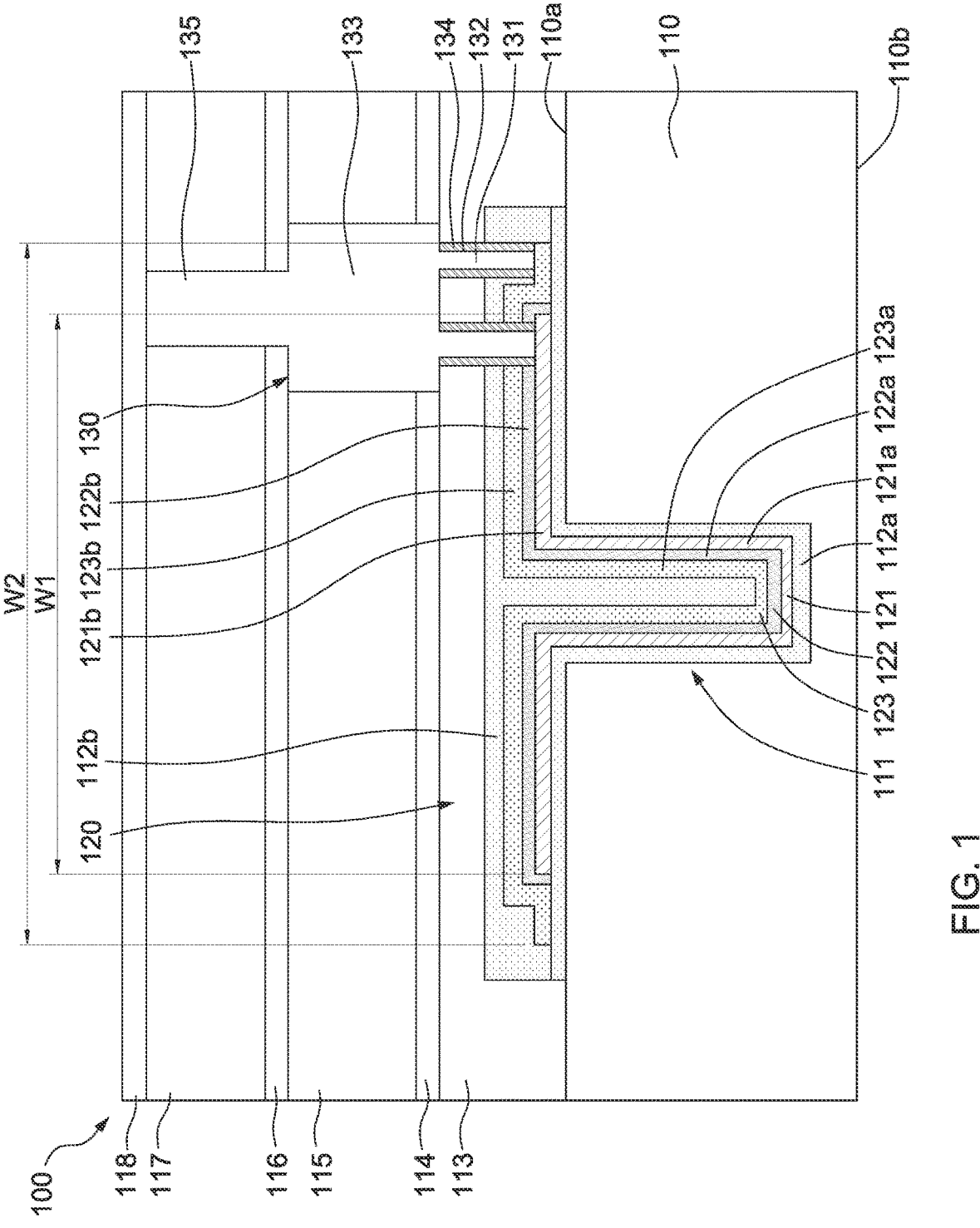
FIG. 1 is a cross-sectional view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard variation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In the present disclosure, a semiconductor structure and a method of manufacturing a semiconductor structure are provided. The semiconductor structure includes a substrate including a recess indented into the substrate, a capacitor structure at least partially disposed within the recess, and an interconnect structure disposed over and electrically connected to the capacitor structure. The capacitor structure includes a first electrode layer, a second electrode layer over the first electrode layer, and a first dielectric between the first electrode layer and the second electrode layer. The first electrode layer includes a first body portion disposed in and conformal to the recess and a first extending portion disposed on the substrate, and the second electrode layer covers the first dielectric, the first body portion and the first extending portion of the first electrode layer. As a result, the first electrode layer can be protected or prevented from further etching by the second electrode layer. An overall reliability of the semiconductor structure can therefore be increased or improved.

In some embodiments, a method of manufacturing a semiconductor structure includes forming a recess on a surface of a substrate, disposing an isolation layer on the surface and extending into the recess, forming a capacitor structure at least partially disposed within the recess, and forming an interconnect structure disposed over and electrically connected to the capacitor structure. The formation of the capacitor structure includes disposing a first electrode layer over the isolation layer, disposing a first dielectric over the first electrode layer, and disposing a second electrode layer to cover and surround the first dielectric and the first electrode layer. Other features and processes may also be included.

FIG. 1 is a schematic cross-sectional view of a semiconductor structure 100 in accordance with some embodiments of the present disclosure. Referring to FIG. 1, the semiconductor structure 100 is a chip, a package or a part of a chip or a package. In some embodiments, the semiconductor structure 100 is a part of a system on integrated circuit (SoIC) structure, a chip on wafer on substrate (CoWoS) structure, integrated fan out (InFO) structure, or the like.

In some embodiments, the semiconductor structure 100 includes a substrate 110. In some embodiments, the substrate 110 includes semiconductive material such as silicon, germanium, gallium, arsenic, or a combination thereof. In some embodiments, the substrate 110 is a semiconductor wafer. In some embodiments, the substrate 110 is a silicon substrate. The substrate 110 includes a first surface 110a and a second surface 110b opposite to the first surface 110a. In some embodiments, the first surface 110a is a front side or an active side with several electrical components disposed thereon. In some embodiments, the second surface 110b is a back side or an inactive side from which electrical components are absent.

The substrate 110 includes a recess 111 indented into the substrate 110. In some embodiments, the recess 111 extends from the first surface 110a toward the second surface 110b of the substrate 110. A dimension, a size and a shape of the recess 111 may be adjusted according to requirements, and are not particularly limited.

In some embodiments, the semiconductor structure 100 includes a capacitor structure 120 and an interconnect structure 130 disposed above and electrically connected to the capacitor structure 120. The capacitor structure 120 is at least partially disposed within the recess 111. In some embodiments, the capacitor structure 120 is configured to provide capacitance for a circuitry in the substrate 110.

In some embodiments, the capacitor structure 120 includes a first isolation layer 112a, a first electrode layer 121, a first dielectric 122, a second electrode layer 123, and a second isolation layer 112b. In some embodiments, the capacitor structure 120 includes several first electrode layers 121, several first dielectrics 122, and several second electrode layers 123 alternately disposed. In some embodiments, the several first electrode layers 121, the several first dielectrics 122, and the several second electrode layers 123 are sequentially stacked between the first isolation layer 112a and the second isolation layer 112b.

In some embodiments, the first isolation layer 112a is disposed over the first surface 110a of the substrate 110 and conformal to the recess 111. The first isolation layer 112a includes dielectric material such as oxide or the like. In some embodiments, the first isolation layer 112a includes silicon dioxide or the like. In some embodiments, the first isolation layer 112a includes high-k (high dielectric constant) dielectric material, such as hafnium aluminum oxide (HfAlO), zirconium dioxide ($ZrO_2$), aluminum oxide, titanium oxide, or the like.

The first electrode layer 121 is disposed over and conformal to the first isolation layer 112a. The first electrode layer 121 is disposed over the first surface 110a of the substrate 110 and is at least partially disposed within the recess 111. In some embodiments, the first electrode layer 121 includes a first body portion 121a disposed in and conformal to the recess 111 and a first extending portion 121b disposed over the first surface 110a of the substrate 110. In some embodiments, the first body portion 121a and the first extending portion 121b are integral and continuous. The first electrode layer 121 includes conductive material such as copper, titanium nitride (TiN), polysilicon or the like.

In some embodiments, a portion of the first isolation layer 112a is exposed through the first electrode layer 121. In some embodiments, the first isolation layer 112a is disposed between the first electrode layer 121 and the substrate 110.

In some embodiments, the first electrode layer 121 is a bottom electrode of the capacitor structure 120.

The first dielectric 122 is disposed over and conformal to the first electrode layer 121. The first dielectric 122 is disposed over the first surface 110a of the substrate 110 and is at least partially disposed within the recess 111. In some embodiments, the first electrode layer 121 is enclosed by the first dielectric 122 and the first isolation layer 112a. In some embodiments, at least a portion of the first dielectric 122 is in contact with the first isolation layer 112a. In some embodiments, the first extending portion 121b of the first electrode layer 121 includes a top surface 121c and a sidewall 121d, and the first dielectric 122 is conformal to and in contact with the top surface 121c and the sidewall 121d of the first extending portion 121b of the first electrode layer 121.

The first dielectric 122 includes dielectric material such as nitride, oxide or the like. In some embodiments, the first dielectric 122 includes high-k dielectric material, such as HfAlO, ZrO$_2$, aluminum oxide, titanium oxide, or the like.

The second electrode layer 123 is disposed over and conformal to the first dielectric 122. The second electrode layer 123 is disposed over the first surface 110a of the substrate 110 and is at least partially disposed within the recess 111. In some embodiments, the second electrode layer 123 covers the first dielectric 122 and the first body portion 121a and the first extending portion 121b of the first electrode layer 121. In some embodiments, a width W2 of the second electrode layer 123 is greater than a width W1 of the first electrode layer 121. In some embodiments, the first electrode layer 121 and the first dielectric 122 are enclosed by the second electrode layer 123 and the isolation layer 112a. In some embodiments, the first dielectric 122 is entirely covered by the second electrode layer 123. In some embodiments, the second electrode layer 123 is a top electrode of the capacitor structure 120. In some embodiments, a portion of the first isolation layer 112a is exposed through the second electrode layer 123. The second electrode layer 123 includes conductive material such as copper, titanium nitride (TiN), polysilicon or the like.

In some embodiments, the second electrode layer 123 includes a second body portion 123a, a second extending portion 123b, and a second protruding portion 123c. The second body portion 123a is disposed in the recess 111 and over the first body portion 121a of the first electrode layer 121. The second extending portion 123b is disposed over the top surface 121c of the first extending portion 121b of the first electrode layer 121, and the second protruding portion 123c surrounds the sidewall 121d of the first extending portion 121b of the first electrode layer 121. In some embodiments, the second body portion 123a, the second extending portion 123b, and the second protruding portion 123c of the second electrode layer 123 are integral and continuous.

In some embodiments, the second protruding portion 123c of the second electrode layer 123 has an L shape. In some embodiments, the second extending portion 123b and the second protruding portion 123c of the second electrode layer 123 form a step structure. In some embodiments, a periphery portion 123d of the second electrode layer 123 is in a stair shape.

The second isolation layer 112b is disposed over the first isolation layer 112a, the first electrode layer 121, the first dielectric 122, and the second electrode layer 123. In some embodiments, the second isolation layer 112b entirely covers the first isolation layer 112a, the first electrode layer 121, the first dielectric 122, and the second electrode layer 123.

The second isolation layer 112b is disposed above the recess 111. In some embodiments, the second isolation layer 112b is at least partially disposed within the recess 111. In some embodiments, the second body portion 123a of the second electrode layer 123 surrounds a portion of the second isolation layer 112b. In some embodiments, the second isolation layer 112b is conformal to the second electrode layer 123, so that a periphery portion of the second isolation layer 112b is in a stair shape.

The second isolation layer 112b includes dielectric material such as oxide or the like. In some embodiments, the second isolation layer 112b includes silicon dioxide or the like. In some embodiments, the second isolation layer 112b includes high-k (high dielectric constant) dielectric material, such as HfAlO, ZrO$_2$, aluminum oxide, titanium oxide, or the like. In some embodiments, the second isolation layer 112b and the first isolation layer 112a include a same material. In some embodiments, an interface between the first isolation layer 112a and the second isolation layer 112b is absent.

In some embodiments, the semiconductor structure 100 includes a first dielectric layer 113 disposed over the substrate 110 and the capacitor structure 120. In some embodiments, the first dielectric layer 113 is disposed on the first surface 110a of the substrate 110 and the second isolation layer 112b of the capacitor structure 120. The first dielectric layer 113 includes dielectric material such as oxide or the like. In some embodiments, the second isolation layer 112b and the first dielectric layer 113 include a same material. In some embodiments, an interface between the second isolation layer 112b and the first dielectric layer 113 is absent.

In some embodiments, the semiconductor structure 100 includes a first passivation layer 114 disposed over the first dielectric layer 113. The first passivation layer 114 includes dielectric material such as polymer, oxide, nitride or the like. In some embodiments, the semiconductor structure 100 includes a second dielectric layer 115 disposed over the first passivation layer 114, and a second passivation layer 116 disposed over the second dielectric layer 115. The second dielectric layer 115 is similar to the first dielectric layer 113. The second passivation layer 116 is similar to the first passivation layer 114. In some embodiments, the first dielectric layer 113, the first passivation layer 114, the second dielectric layer 115 and the second passivation layer 116 are sequentially stacked over the substrate 110. In some embodiments, several dielectric layers and several passivation layers are alternately disposed over the substrate 110.

The interconnect structure 130 is disposed above and electrically connected to the capacitor structure 120. In some embodiments, the interconnect structure 130 includes a conductive via 131, and a conductive member 133 coupled to the conductive via 131. In some embodiments, the conductive via 131 extends through the first dielectric layer 113 and the second isolation layer 112b and is surrounded by a third isolation layer 134. The third isolation layer 134 is disposed on a sidewall 132 of the conductive via 131. In some embodiments, the conductive member 133 extends through and is surrounded by the second dielectric layer 115 and the first passivation layer 114. The conductive member 133 is disposed above and electrically connected to the conductive via 131 and the third isolation layer 134.

The conductive via 131 is disposed between the conductive member 133 and the first surface 110a of the substrate 110. The conductive via 131 is electrically coupled to the conductive member 133. In some embodiments, the conductive via 131 extends through the second isolation layer 112b and the first dielectric layer 113. The conductive via 131 is at least partially surrounded by the second isolation layer 112b. The third isolation layer 134 is disposed between the conductive member 133 and the first surface 110a of the substrate 110. In some embodiments, the third isolation layer 134 extends through the second isolation layer 112b and the first dielectric layer 113. The third isolation layer 134 is at least partially surrounded by the second isolation layer 112b. In some embodiments, at least a portion of the third isolation layer 134 is disposed between the second isolation layer 112b and the conductive via 131.

The conductive member 133 includes conductive material such as copper, silver or the like. The conductive via 131 includes conductive material such as copper, silver or the like. In some embodiments, the conductive via 131 and the conductive member 133 include a same material. The third isolation layer 134 includes dielectric material such as oxide or the like. In some embodiments, the third isolation layer 134 includes silicon dioxide or the like. In some embodiments, the third isolation layer 134 includes high-k (high dielectric constant) dielectric material, such as HfAlO, $ZrO_2$, aluminum oxide, titanium oxide, or the like. In some embodiments, the third isolation layer 134 and the second isolation layer 112b include a same material. In some embodiments, an interface between the third isolation layer 134 and the second isolation layer 112b is absent.

In some embodiments, the conductive via 131 is electrically coupled to the first electrode layer 121. In some embodiments, the conductive via 131 is electrically coupled to the second electrode layer 123. In some embodiments, the conductive member 133 is electrically connected to the first electrode layer 121 via the conductive via 131. In some embodiments, the conductive member 133 is electrically connected to the second electrode layer 123 via the conductive via 131. In some embodiments, the conductive member 133 is electrically connected to both the first electrode layer 121 and the second electrode layer 123 via one or more of the conductive vias 131. In some embodiments, the interconnect structure 130 includes one or more of the conductive members 133. In some embodiments, the conductive vias 131 have different lengths, such that the conductive via 131 contacting the first electrode layer 121 is longer than the conductive via 131 contacting the second electrode layer 123. In some embodiments, the conductive via 131 contacting the first electrode layer 121 is electrically isolated from the second electrode layer 123. In some embodiments, the conductive via 131 contacting the second electrode layer 123 is electrically isolated from the first electrode layer 121. In some embodiments, one or more of the third isolation layers 134 surround the conductive vias 131. In some embodiments, each of the third isolation layers 134 surrounds the corresponding conductive via 131.

In some embodiments, the interconnect structure 130 includes several conductive vias 135 disposed above the conductive member 133. The conductive vias above the conductive member 133 are surrounded by the dielectric layers and the passivation layers stacked over the second passivation layer 116. In some embodiments, the last conductive via 135 is surrounded by a last dielectric layer 117 and is partially exposed through a last passivation layer 118 to electrically connect to an external conductive structure such as a conductive bump or the like.

Figure 2:
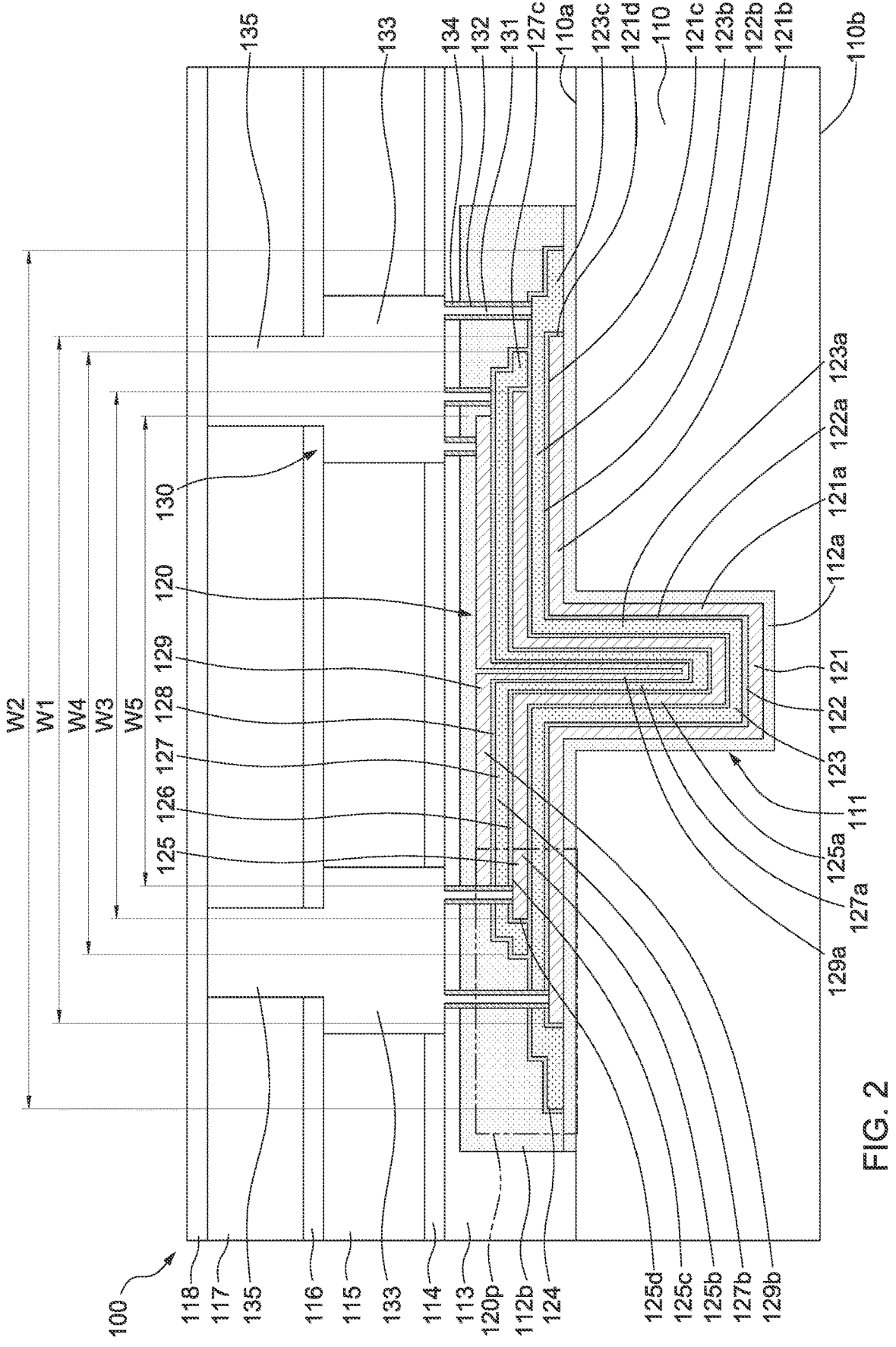
FIG. 2 is a cross-sectional view of a semiconductor structure in accordance with some embodiments of the present disclosure.
Figure 3:
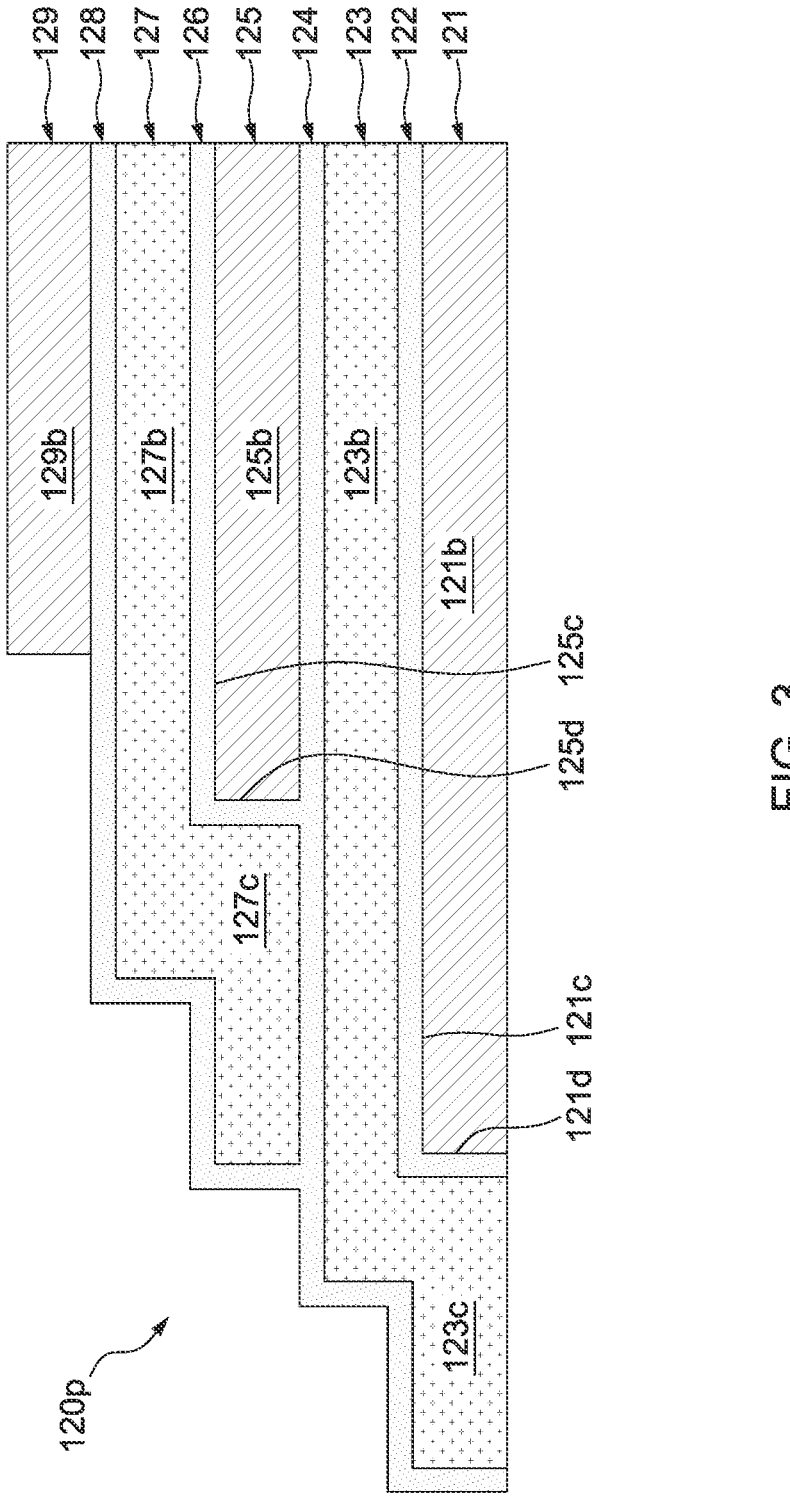
FIG. 3 is a cross-sectional view of a part of the semiconductor structure in FIG. 2 in accordance with some embodiments of the present disclosure.

FIG. 2 is a schematic cross-sectional view of another embodiment of the semiconductor structure 100. FIG. 3 is a schematic cross-sectional view of a periphery portion 120p of the embodiment of the semiconductor structure 100 shown in FIG. 2. The periphery portion 120p of the capacitor structure 120 of the semiconductor structure 100 shown in FIG. 2 is illustrated in FIG. 3. The semiconductor structure 100 illustrated in FIGS. 2 and 3 is similar to the semiconductor structure 100 illustrated in FIG. 1, except the capacitor structure 120 of the semiconductor structure 100 of FIGS. 2 and 3 further includes a third electrode layer 125 disposed over the second electrode layer 123, a second dielectric 124 between the second electrode layer 123 and the third electrode layer 125, a fourth electrode layer 127 disposed over the third electrode layer 125, and a third dielectric 126 between the third electrode layer 125 and the fourth electrode layer 127. In some embodiments, the capacitor structure 120 of the semiconductor structure 100 shown in FIGS. 2 and 3 further includes a fifth electrode layer 129 disposed over the fourth electrode layer 127, and a fourth dielectric 128 between the fourth electrode layer 127 and the fifth electrode layer 129.

The third electrode layer 125 is disposed over and conformal to the second dielectric 124. In some embodiments, the second dielectric 124 covers and surrounds the second electrode layer 123. The third electrode layer 125 is disposed over the second electrode layer 123 and is at least partially disposed within the recess 111. In some embodiments, the third electrode layer 125 covers the entire second body portion 123a of the second electrode layer 123, and covers a portion of the second extending portion 123b of the second electrode layer 123 and a portion of the second dielectric 124. In some embodiments, a width W3 of the third electrode layer 125 is less than the width W2 of the second electrode layer 123. In some embodiments, the second protruding portion 123c and a portion of the second extending portion 123b of the second electrode layer 123 are exposed by the third electrode layer 125. In some embodiments, a portion of the second dielectric 124 is exposed by the third electrode layer 125. In some embodiments, the third electrode layer 125 is a top electrode of the capacitor structure 120.

In some embodiments, the third electrode layer 125 includes a third body portion 125a and a third extending portion 125b. The third body portion 125a is disposed in the recess 111 and over the second body portion 123a of the second electrode layer 123. The third extending portion 125b is disposed over the second extending portion 123b of the second electrode layer 123. In some embodiments, the third body portion 125a and the third extending portion 125b of the third electrode layer 125 are integral and continuous. The third electrode layer 125 includes conductive material such as copper, titanium nitride (TiN), polysilicon or the like.

The second dielectric 124 is disposed over and conformal to the second electrode layer 123. In some embodiments, the second dielectric 124 is disposed over the first surface 110a of the substrate 110 and is at least partially disposed within the recess 111. In some embodiments, the second dielectric 124 surrounds the second electrode layer 123. In some embodiments, the second electrode layer 123 is enclosed by the second dielectric 124, the first dielectric 122 and the first isolation layer 112a. In some embodiments, at least a portion of the second dielectric 124 is in contact with the first isolation layer 112a. In some embodiments, the second dielectric 124 is conformal to and in contact with the second extending portion 123b and the second protruding portion 123c of the second electrode layer 123. In some embodiments, the second dielectric 124 has a step structure conformal to the step structure formed by the second extending portion 123b and the second protruding portion 123c of the second electrode layer 123. In some embodiments, a portion of the second dielectric 124 is disposed between the third electrode layer 125 and the second electrode layer 123, and a portion of the second dielectric 124 is disposed between the fourth electrode layer 127 and the second electrode layer 123.

The second dielectric 124 includes dielectric material such as nitride, oxide or the like. In some embodiments, the second dielectric 124 includes high-k dielectric material, such as HfAlO, $ZrO_2$, aluminum oxide, titanium oxide, or the like.

The fourth electrode layer 127 is disposed over and conformal to the third dielectric 126. The fourth electrode layer 127 is disposed over the first surface 110a of the substrate 110 and is at least partially disposed within the recess 111. In some embodiments, the fourth electrode layer 127 covers the third dielectric 126 and the third electrode layer 125. In some embodiments, the fourth electrode layer 127 covers a portion of the second dielectric 124 and a portion of the second extending portion 123b of the second electrode layer 123. In some embodiments, a width W4 of the fourth electrode layer 127 is greater than the width W3 of the third electrode layer 125. In some embodiments, the width W4 of the fourth electrode layer 127 is less than the width W2 of the second electrode layer 123. In some embodiments, the width W4 of the fourth electrode layer 127 is similar to or different from the width W1 of the first electrode layer 121. In some embodiments, the third electrode layer 125 and the third dielectric 126 are enclosed by the fourth electrode layer 127 and the second dielectric 124. In some embodiments, the fourth electrode layer 127 is a top electrode of the capacitor structure 120. In some embodiments, a portion of the fourth electrode layer 127 is exposed through the fifth electrode layer 129.

In some embodiments, the fourth electrode layer 127 includes a fourth body portion 127a, a fourth extending portion 127b, and a fourth protruding portion 127c. The fourth body portion 127a is disposed in the recess 111 and over the third body portion 125a of the third electrode layer 125. The fourth extending portion 127b is disposed over a top surface 125c of the third extending portion 125b of the third electrode layer 125, and the fourth protruding portion 127c surrounds a sidewall 125d of the third extending portion 125b of the third electrode layer 125. In some embodiments, the fourth body portion 127a, the fourth extending portion 127b, and the fourth protruding portion 127c of the fourth electrode layer 127 are integral and continuous.

In some embodiments, the fourth protruding portion 127c of the fourth electrode layer 127 has an L shape. In some embodiments, the fourth extending portion 127b and the fourth protruding portion 127c of the fourth electrode layer 127 form a step structure. In some embodiments, a periphery portion of the fourth electrode layer 127 is in a stair shape.

The fourth electrode layer 127 includes conductive material such as copper, titanium nitride (TiN), polysilicon or the like. In some embodiments, the third dielectric 126 is entirely covered by the fourth electrode layer 127.

The third dielectric 126 is disposed over and conformal to the third electrode layer 125. The third dielectric 126 is disposed over the first surface 110a of the substrate 110 and is at least partially disposed within the recess 111. In some embodiments, the third electrode layer 125 is enclosed by the third dielectric 126 and the second dielectric 124. In some embodiments, at least a portion of the third dielectric 126 is in contact with the second dielectric 124. In some embodiments, the third dielectric 126 is conformal to and in contact with the top surface 125c and the sidewall 125d of the third extending portion 125b of the third electrode layer 125.

The third dielectric 126 includes dielectric material such as nitride, oxide or the like. In some embodiments, the third dielectric 126 includes high-k dielectric material, such as HfAlO, $ZrO_2$, aluminum oxide, titanium oxide, or the like.

The fifth electrode layer 129 is disposed over the fourth dielectric 128. In some embodiments, the fourth dielectric 128 covers the fourth electrode layer 127. The fifth electrode layer 129 is disposed over the fourth electrode layer 127 and is at least partially disposed within the recess 111. In some embodiments, the fifth electrode layer 129 covers the entire fourth body portion 127a of the fourth electrode layer 127, and covers a portion of the fourth extending portion 127b of the fourth electrode layer 127 and a portion of the fourth dielectric 128. In some embodiments, a width W5 of the fifth electrode layer 129 is less than the width W4 of the fourth electrode layer 127. In some embodiments, the width W5 of the fifth electrode layer 129 is similar to or different from the width W3 of the third electrode layer 125. In some embodiments, the width W5 of the fifth electrode layer 129 is less than the width W1 of the first electrode layer 121. In some embodiments, the fourth protruding portion 127c and a portion of the fourth extending portion 127b of the fourth electrode layer 127 are exposed by the fifth electrode layer 129. In some embodiments, a portion of the fourth dielectric 128 is exposed by the fifth electrode layer 129. In some embodiments, the fifth electrode layer 129 is the top electrode of the capacitor structure 120.

In some embodiments, the fifth electrode layer 129 includes a fifth body portion 129a and a fifth extending portion 129b. The fifth body portion 129a is disposed in the recess 111 and over the fourth body portion 127a of the fourth electrode layer 127. The fifth extending portion 129b is disposed over the fourth extending portion 127b of the fourth electrode layer 127. In some embodiments, the fifth body portion 129a and the fifth extending portion 129b of the fifth electrode layer 129 are integral and continuous. The fifth electrode layer 129 includes conductive material such as copper, titanium nitride (TiN), polysilicon or the like.

The fourth dielectric 128 is disposed over and conformal to the fourth electrode layer 127. The fourth dielectric 128 is disposed over the first surface 110a of the substrate 110 and is at least partially disposed within the recess 111. In some embodiments, the fourth electrode layer 127 is enclosed by the fourth dielectric 128, the third dielectric 126 and the second dielectric 124. In some embodiments, at least a portion of the fourth dielectric 128 is in contact with the second dielectric 124. In some embodiments, the fourth dielectric 128 is conformal to and in contact with the fourth extending portion 127b and the fourth protruding portion 127c of the fourth electrode layer 127. In some embodiments, the fourth dielectric 128 has a step structure conformal to the step structure formed by the fourth extending portion 127b and the fourth protruding portion 127c of the fourth electrode layer 127. In some embodiments, a portion of the fourth dielectric 128 is disposed between the fifth electrode layer 129 and the fourth electrode layer 127, and a portion of the fourth dielectric 128 is exposed by the fifth electrode layer 129.

The fourth dielectric 128 includes dielectric material such as nitride, oxide or the like. In some embodiments, the fourth dielectric 128 includes high-k dielectric material, such as HfAlO, $ZrO_2$, aluminum oxide, titanium oxide, or the like.

In some embodiments, the conductive via 131 is electrically coupled to the third electrode layer 125. In some embodiments, the conductive via 131 is electrically coupled to the fourth electrode layer 127. In some embodiments, the conductive via 131 is electrically coupled to the fifth electrode layer 129. In some embodiments, the conductive member 133 is electrically connected to the third electrode layer 125 via the conductive via 131. In some embodiments, the conductive member 133 is electrically connected to the fourth electrode layer 127 via the conductive via 131. In some embodiments, the conductive member 133 is electrically connected to the fifth electrode layer 129 via the conductive via 131. In some embodiments, the one or more conductive members 133 are electrically connected to the third electrode layer 125, the fourth electrode layer 127 and the fifth electrode layer 129 via one or more of the conductive vias 131. In some embodiments, the conductive via 131 contacting the third electrode layer 125 is longer than the conductive via 131 contacting the fourth electrode layer 127. In some embodiments, the conductive via 131 contacting the fourth electrode layer 127 is longer than the conductive via 131 contacting the fifth electrode layer 129. In some embodiments, the conductive via 131 contacting the third electrode layer 125 is electrically isolated from the fourth electrode layer 127 and the fifth electrode layer 129. In some embodiments, the conductive via 131 contacting the fourth electrode layer 127 is electrically isolated from the fifth electrode layer 129.

Figure 4:
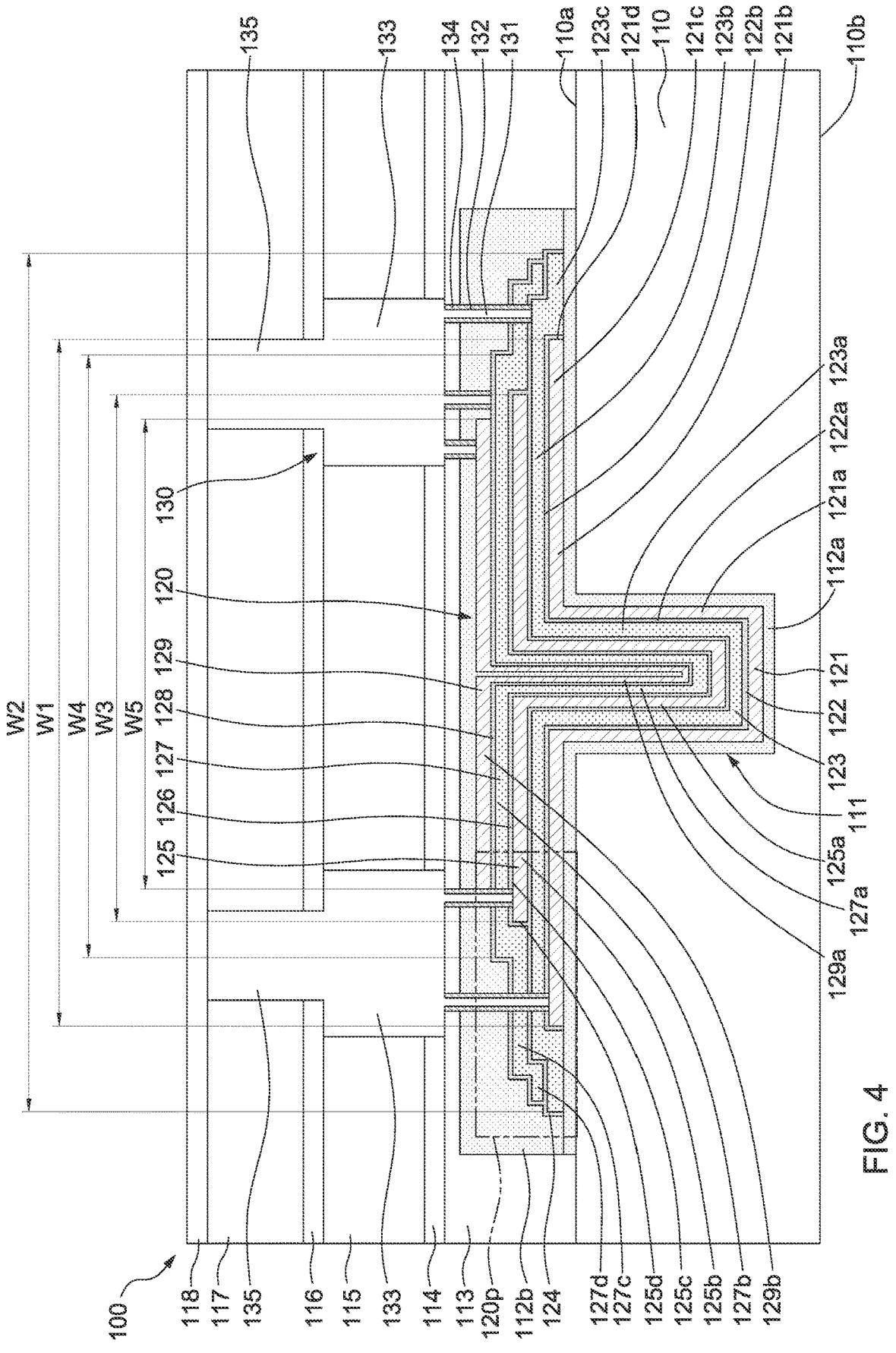
FIG. 4 is a cross-sectional view of a semiconductor structure in accordance with some embodiments of the present disclosure.
Figure 5:
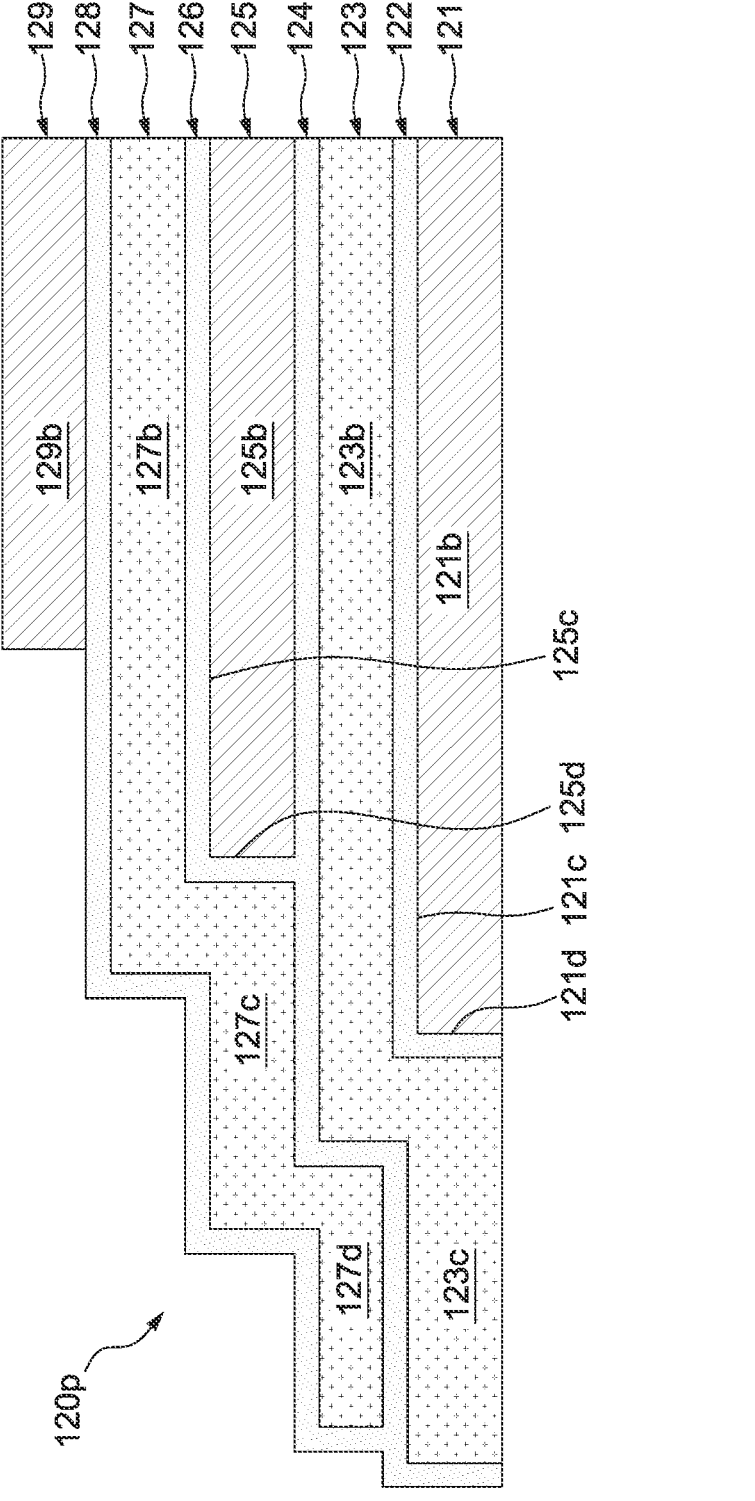
FIG. 5 is a cross-sectional view of a part of the semiconductor structure in FIG. 4 in accordance with some embodiments of the present disclosure.

FIG. 4 is a schematic cross-sectional view of another embodiment of the semiconductor structure 100. FIG. 5 is a schematic cross-sectional view of a periphery portion 120p of the embodiment of the semiconductor structure 100 shown in FIG. 4. The periphery portion 120p of the capacitor structure 120 of the semiconductor structure 100 shown in FIG. 4 is illustrated in FIG. 5. The semiconductor structure 100 illustrated in FIGS. 4 and 5 is similar to the semiconductor structure 100 illustrated in FIGS. 2 and 3, except the fourth electrode layer 127 of the capacitor structure 120 of the semiconductor structure 100 shown in FIGS. 4 and 5 further includes a fifth protruding portion 127d. The fifth protruding portion 127d is disposed over at least a portion of the second protruding portion 123c of the second electrode layer 123 and adjacent to the second extending portion 123b of the second electrode layer 123. In some embodiments, the fourth electrode layer 127 is conformal to the third electrode layer 125 and the second electrode layer 123. In some embodiments, the fourth body portion 127a, the fourth extending portion 127b, the fourth protruding portion 127c, and the fifth protruding portion 127d of the fourth electrode layer 127 are integral and continuous.

In some embodiments, the fifth protruding portion 127d of the fourth electrode layer 127 has an L shape. In some embodiments, the fourth extending portion 127b, the fourth protruding portion 127c, and the fifth protruding portion 127d of the fourth electrode layer 127 form a step structure. In some embodiments, a periphery portion of the fourth electrode layer 127 is in a stair shape.

Figure 6:
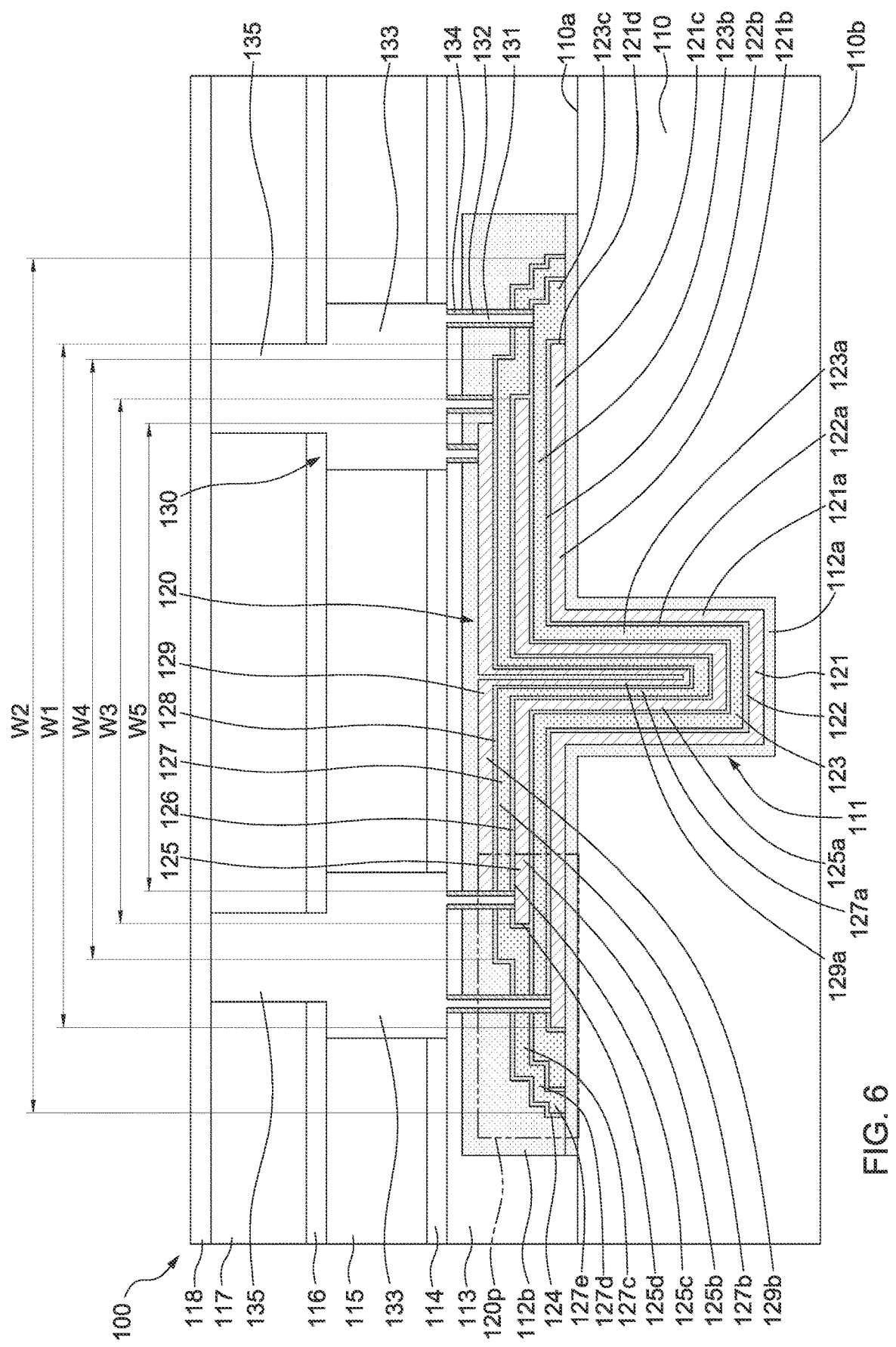
FIG. 6 is a cross-sectional view of a semiconductor structure in accordance with some embodiments of the present disclosure.
Figure 7:
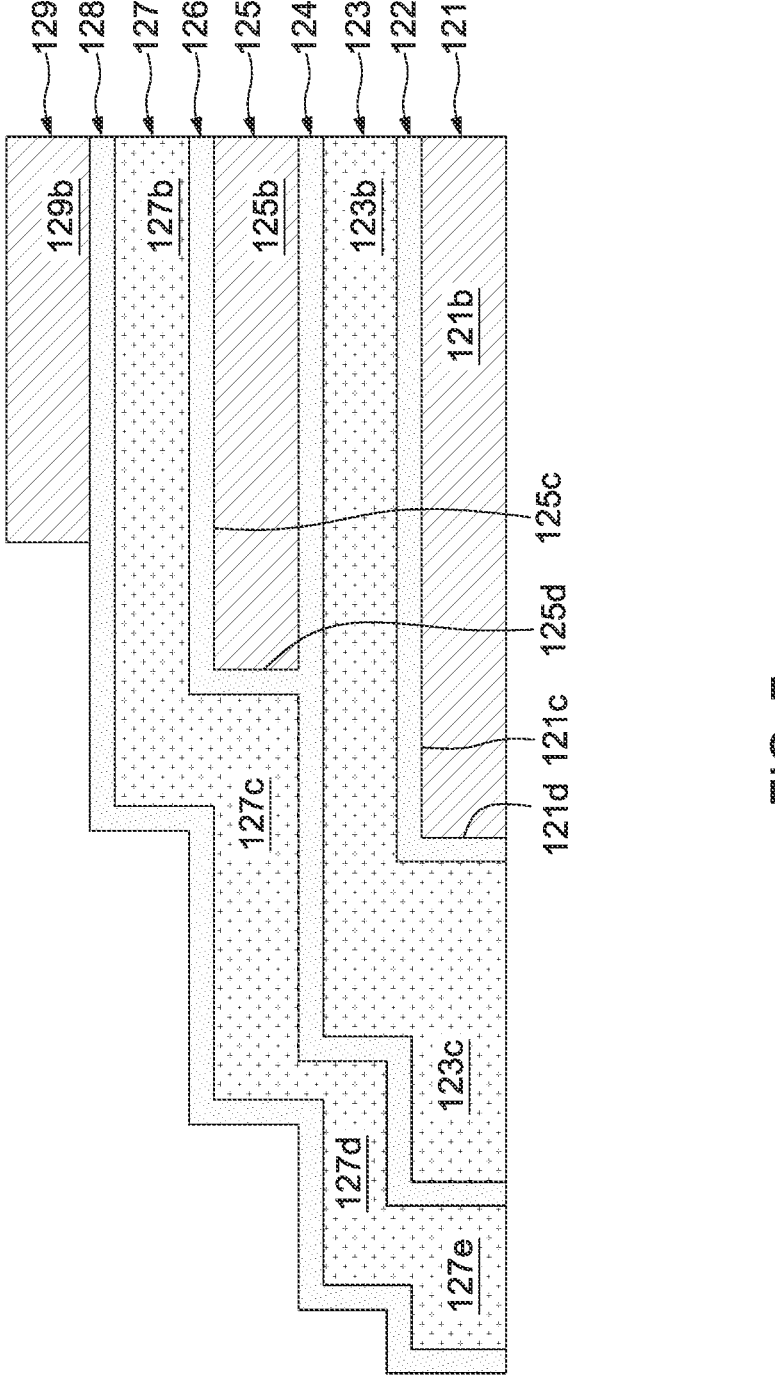
FIG. 7 is a cross-sectional view of a part of the semiconductor structure in FIG. 6 in accordance with some embodiments of the present disclosure.

FIG. 6 is a schematic cross-sectional view of another embodiment of the semiconductor structure 100. FIG. 7 is a schematic cross-sectional view of a periphery portion 120p of the embodiment of the semiconductor structure 100 shown in FIG. 6. The periphery portion 120p of the capacitor structure 120 of the semiconductor structure 100 shown in FIG. 6 is illustrated in FIG. 7. The semiconductor structure 100 illustrated in FIGS. 6 and 7 is similar to the semiconductor structure 100 illustrated in FIGS. 4 and 5, except the fourth electrode layer 127 of the capacitor structure 120 of the semiconductor structure illustrated in FIGS. 6 and 7 further includes a sixth protruding portion 127e. The sixth protruding portion 127e is disposed adjacent to the second protruding portion 123c of the second electrode layer 123. In some embodiments, the sixth protruding portion 127e is in contact with the first isolation layer 121a. In some embodiments, the fourth body portion 127a, the fourth extending portion 127b, the fourth protruding portion 127c, the fifth protruding portion 127d and the sixth protruding portion 127e of the fourth electrode layer 127 are integral and continuous.

In some embodiments, the sixth protruding portion 127e of the fourth electrode layer 127 has an L shape. In some embodiments, the fourth extending portion 127b, the fourth protruding portion 127c, the fifth protruding portion 127d, and the sixth protruding portion 127e of the fourth electrode layer 127 form a step structure.

Figure 8:
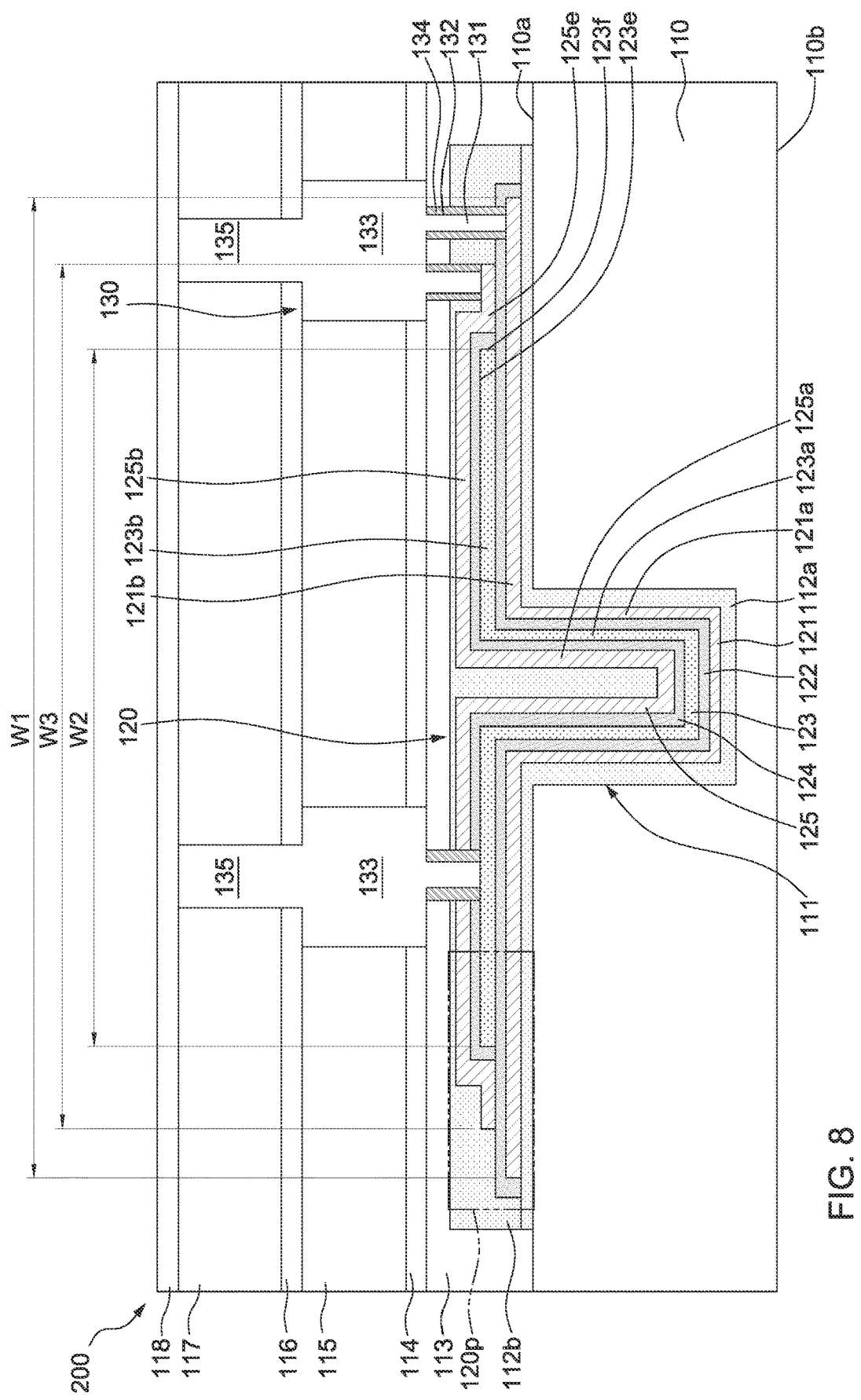
FIG. 8 is a cross-sectional view of a semiconductor structure in accordance with some embodiments of the present disclosure.

FIG. 8 is a schematic cross-sectional view of an embodiment of a semiconductor structure 200. The semiconductor structure 200 illustrated in FIG. 8 is similar to the semiconductor structure 100 illustrated in FIG. 1, except at least a portion of the first extending portion 121b of the first electrode layer 121 is exposed through the second electrode layer 123, the capacitor structure 120 further includes the third electrode layer 125, and the second electrode layer 123 is enclosed by the first electrode layer 121 and the third electrode layer 125. In some embodiments, referring to FIG. 8, at least a portion of the first dielectric 122 is exposed by the second electrode layer 123. In some embodiments, the second electrode layer 123 is separated from the first isolation layer 112a. In some embodiments, the width W1 of the first electrode layer 121 is greater than the width W2 of the second electrode layer 123. In some embodiments, the width W3 of the third electrode layer 125 is greater than the width W2 of the second electrode layer 123.

In some embodiments, the third electrode layer 125 further includes a third protruding portion 125e surrounding a sidewall 123f of the second electrode layer 123. In some embodiments, the third extending portion 125b is disposed over a top surface 123e of the second electrode layer 123, and the third protruding portion 125e is disposed adjacent to the sidewall 123f of the second electrode layer 123. In some embodiments, the third extending portion 125b and the third protruding portion 125e of the third electrode layer 125 are integral and continuous. In some embodiments, the third protruding portion 125e of the third electrode layer 125 has an L shape. In some embodiments, the third extending portion 125b and the third protruding portion 125e of the third electrode layer 125 and the first dielectric 122 exposed through the third protruding portion 125e form a step structure. In some embodiments, a periphery portion of the third electrode layer 125 is in a stair shape.

Figure 9:
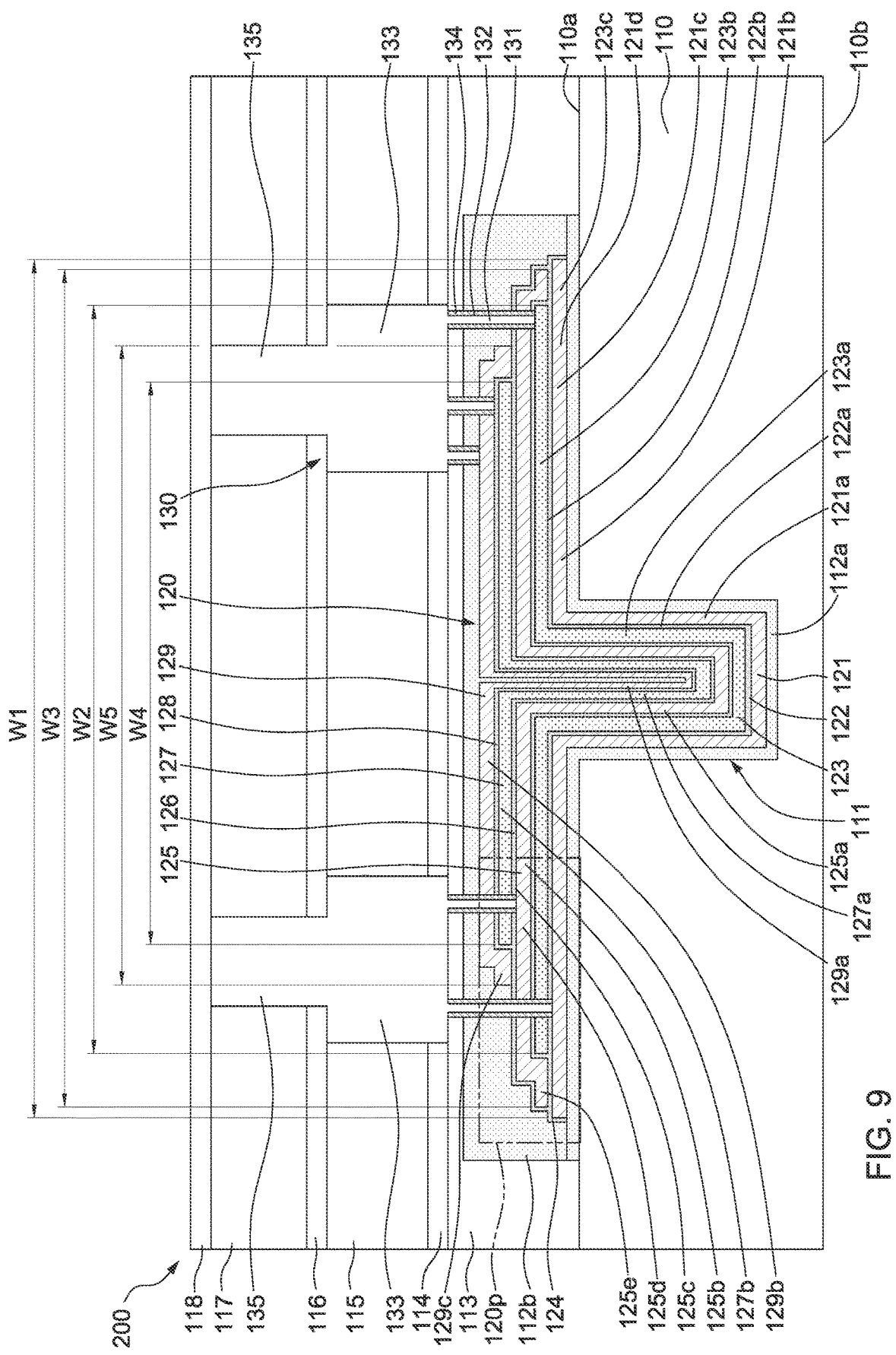
FIG. 9 is a cross-sectional view of a semiconductor structure in accordance with some embodiments of the present disclosure.
Figure 10:
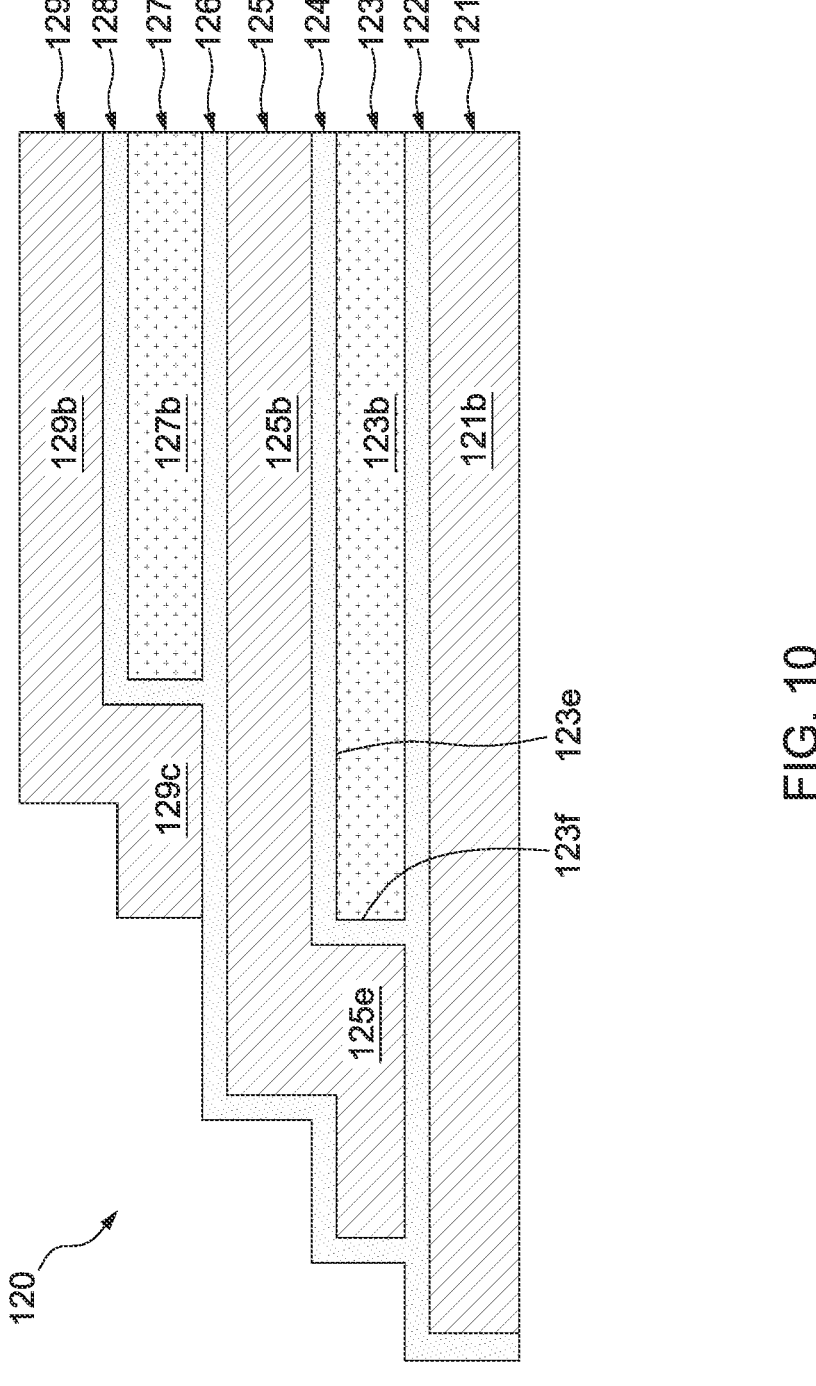
FIG. 10 is a cross-sectional view of a part of the semiconductor structure in FIG. 9 in accordance with some embodiments of the present disclosure.

FIG. 9 is a schematic cross-sectional view of another embodiment of the semiconductor structure 200. FIG. 10 is a schematic cross-sectional view of a periphery portion 120p of the embodiment of the semiconductor structure 200 shown in FIG. 9. The periphery portion 120p of the capacitor structure 120 of the semiconductor structure 200 shown in FIG. 9 is illustrated in FIG. 10. The semiconductor structure 200 illustrated in FIGS. 9 and 10 is similar to the semiconductor structure 200 illustrated in FIG. 8, except a fourth electrode layer 127 of the capacitor structure 120 is disposed over the third electrode layer 125, and a fifth electrode layer 129 is disposed over the fourth electrode layer 127. The fourth electrode layer 127 is enclosed by the third electrode layer 125 and the fifth electrode layer 129. In some embodiments, a fourth extending portion 127b is disposed over the third extending portion 125b, and a portion of the third extending portion 125b is exposed by the fourth extending portion 127b. The fifth electrode layer 129 includes a fifth extending portion 129b and a seventh protruding portion 129c connected to the fifth extending portion 129b.

The seventh protruding portion 129c is disposed on the third extending portion 125b of the third electrode layer 125 and adjacent to the fourth extending portion 127b of the fourth electrode layer 127. In some embodiments, the seventh protruding portion 129c is in contact with the third extending portion 125b and the fourth extending portion 127b. In some embodiments, a portion of the third extending portion 125b is exposed by the seventh protruding portion 129c. In some embodiments, a fifth body portion 129a, the fifth extending portion 129b, and the seventh protruding portion 129c of the fifth electrode layer 129 are integral and continuous.

In some embodiments, the seventh protruding portion 129c of the fifth electrode layer 129 has an L shape. In some embodiments, the fifth extending portion 129b and the seventh protruding portion 129c of the fifth electrode layer 129 form a step structure. In some embodiments, the fifth extending portion 129b, the seventh protruding portion 129c, the third protruding portion 125e, and the first extending portion 121b form a stair structure.

Figure 11:
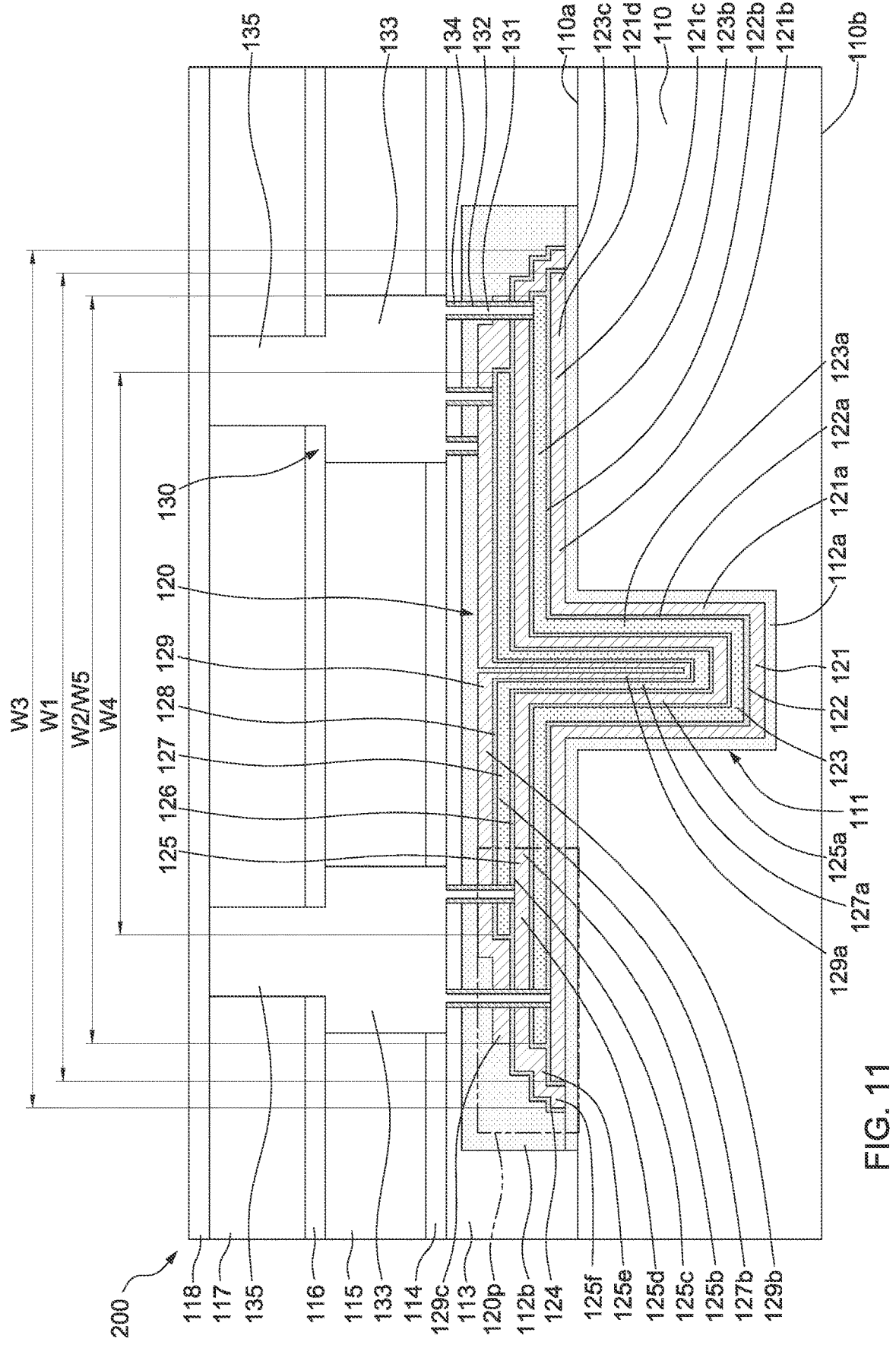
FIG. 11 is a cross-sectional view of a semiconductor structure in accordance with some embodiments of the present disclosure.
Figure 12:
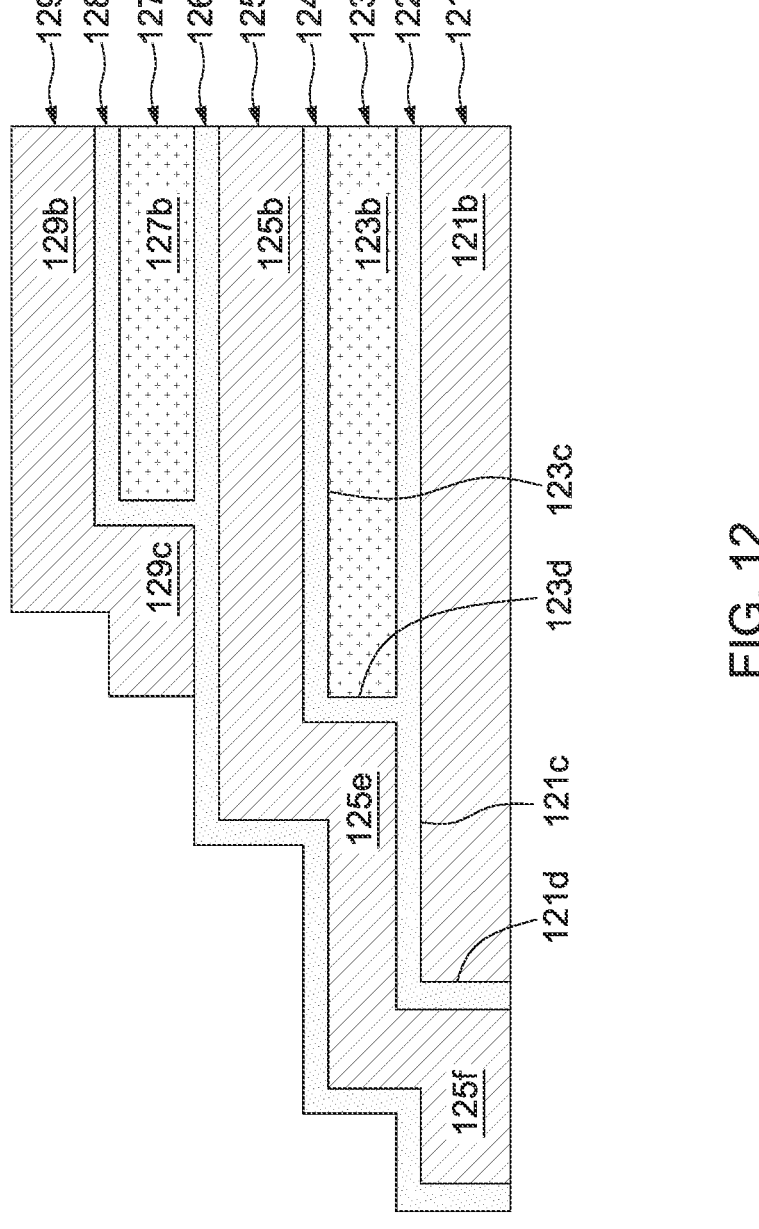
FIG. 12 is a cross-sectional view of a part of the semiconductor structure in FIG. 11 in accordance with some embodiments of the present disclosure.

FIG. 11 is a schematic cross-sectional view of another embodiment of the semiconductor structure 200. FIG. 12 is a schematic cross-sectional view of a periphery portion 120p of the embodiment of the semiconductor structure 200 shown in FIG. 11. The periphery portion 120p of the capacitor structure 120 of the semiconductor structure 200 shown in FIG. 11 is illustrated in FIG. 12. The semiconductor structure 200 illustrated in FIGS. 11 and 12 is similar to the semiconductor structure 200 illustrated in FIGS. 9 and 10, except the third electrode layer 125 of the capacitor structure 120 further includes an eighth protruding portion 125f connected to the third protruding portion 125e. In some embodiments, the eighth protruding portion 125f is disposed over the first isolation layer 112a and adjacent to the first extending portion 121b.

In some embodiments, the first electrode layer 121 and second electrode layer 123 are enclosed by the third electrode layer 125 and the first isolation layer 112a. In some embodiments, the eighth protruding portion 125f is in contact with a sidewall 121d of the first extending portion 121b and the third protruding portion 125e. In some embodiments, the third body portion 125a, the third extending portion 125b, the third protruding portion 125e, and the eighth protruding portion 125f of the third electrode layer 125 are integral and continuous.

In some embodiments, the eighth protruding portion 125f of the third electrode layer 125 has an L shape. In some embodiments, the third extending portion 125b, the third protruding portion 125c and the eighth protruding portion 125f of the third electrode layer 125 form a step structure. In some embodiments, the fifth extending portion 129b, the seventh protruding portion 129c, the third protruding portion 125e, and the eighth protruding portion 125f form a stair structure.

Figure 13:
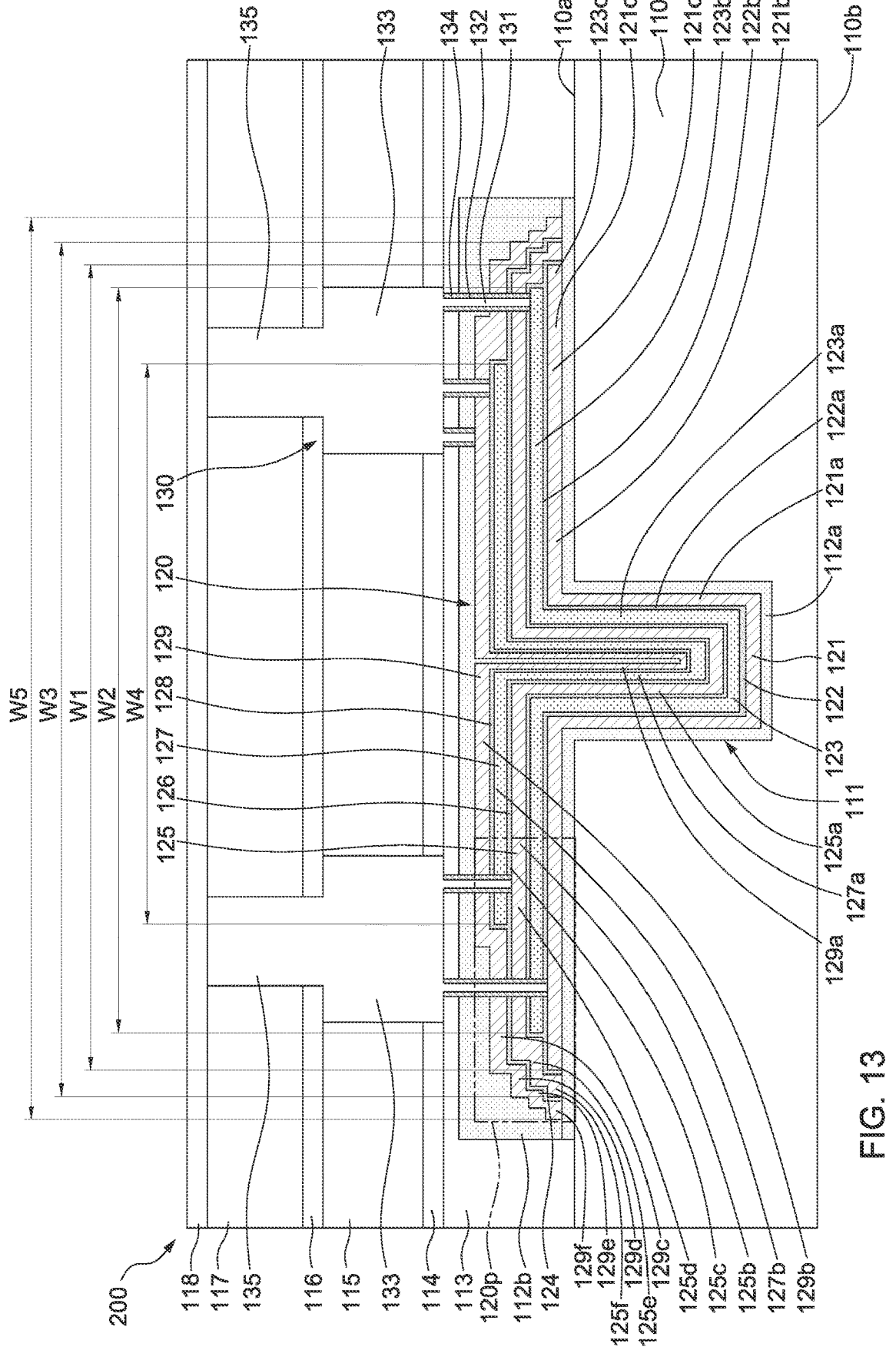
FIG. 13 is a cross-sectional view of a semiconductor structure in accordance with some embodiments of the present disclosure.
Figure 14:
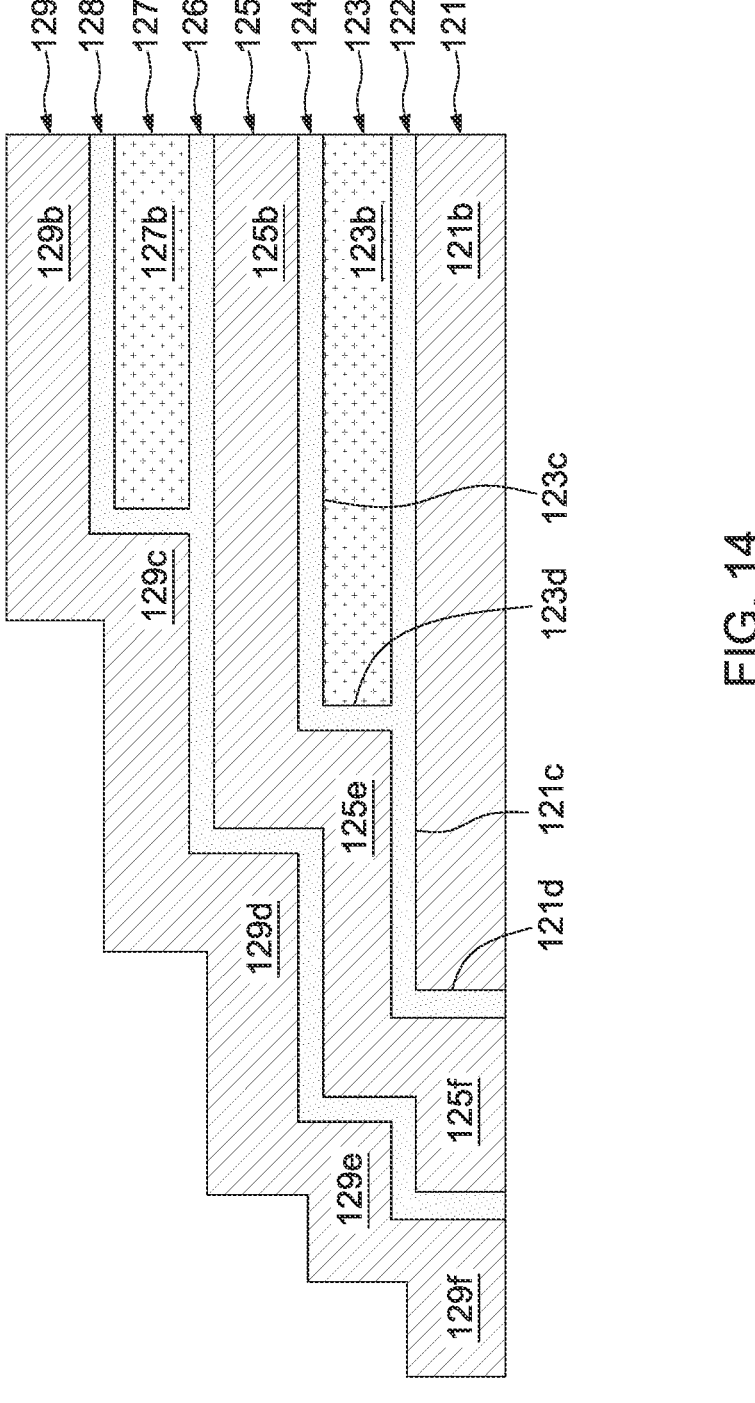
FIG. 14 is a cross-sectional view of a part of the semiconductor structure in FIG. 13 in accordance with some embodiments of the present disclosure.

FIG. 13 is a schematic cross-sectional view of another embodiment of the semiconductor structure 200. FIG. 14 is a schematic cross-sectional view of a periphery portion 120p of the embodiment of the semiconductor structure 200 shown in FIG. 13. The periphery portion 120p of the capacitor structure 120 of the semiconductor structure 200 shown in FIG. 13 is illustrated in FIG. 14. The semiconductor structure 200 illustrated in FIGS. 13 and 14 is similar to the semiconductor structure 200 illustrated in FIGS. 11 and 12, except the fifth electrode layer 129 of the capacitor structure 120 further includes a ninth protruding portion 129d connected to the seventh protruding portion 129c. The ninth protruding portion 129d is disposed on the third protruding portion 125e and adjacent to the third extending portion 125b and the seventh protruding portion 129c. In some embodiments, the fifth electrode layer 129 further includes a tenth protruding portion 129e connected to the ninth protruding portion 129d. The tenth protruding portion 129e is disposed on the eighth protruding portion 125f and adjacent to the ninth protruding portion 129d and the third protruding portion 125e.

In some embodiments, the fifth electrode layer 129 further includes an eleventh protruding portion 129f connected to the tenth protruding portion 129e. The eleventh protruding portion 129f is disposed on the first isolation layer 112a and adjacent to the tenth protruding portion 129e and the eighth protruding portion 125f. In some embodiments, the eleventh protruding portion 129f is in contact with the first isolation layer 112a, the eighth protruding portion 125f of the third electrode layer 125, and the tenth protruding portion 129e.

In some embodiments, the first electrode layer 121, the second electrode layer 123, the third electrode layer 125 and the fourth electrode layer 127 are enclosed by the fifth electrode layer 129 and the first isolation layer 112a. In some embodiments, the fifth body portion 129a, the fifth extending portion 129b, the seventh protruding portion 129c, the ninth protruding portion 129d, the tenth protruding portion 129e and the eleventh protruding portion 129f of the fifth electrode layer 129 are integral and continuous.

In some embodiments, each of the ninth protruding portion 129d, the tenth protruding portion 129e and the eleventh protruding portion 129f of the fifth electrode layer 129 has an L shape. In some embodiments, the fifth extending portion 129b, the seventh protruding portion 129c, the ninth protruding portion 129d, the tenth protruding portion 129e and the eleventh protruding portion 129f of the fifth electrode layer 129 form a step structure or a stair structure.

In the present disclosure, a method of manufacturing the semiconductor structure 100 is also disclosed. In some embodiments, the semiconductor structure 100 is fabricated by a method 300. The method 300 includes a number of operations and the description and illustration are not deemed as a limitation to the sequence of operations. FIG. 15 is an embodiment of the method 300 of manufacturing the semiconductor structure 100. The method 300 includes a number of operations (301, 302, 303, and 304). FIGS. 16 to 22 are cross-sectional views of one or more operations of the method for manufacturing a semiconductor structure in accordance with some embodiments of the present disclosure.

Figure 16:
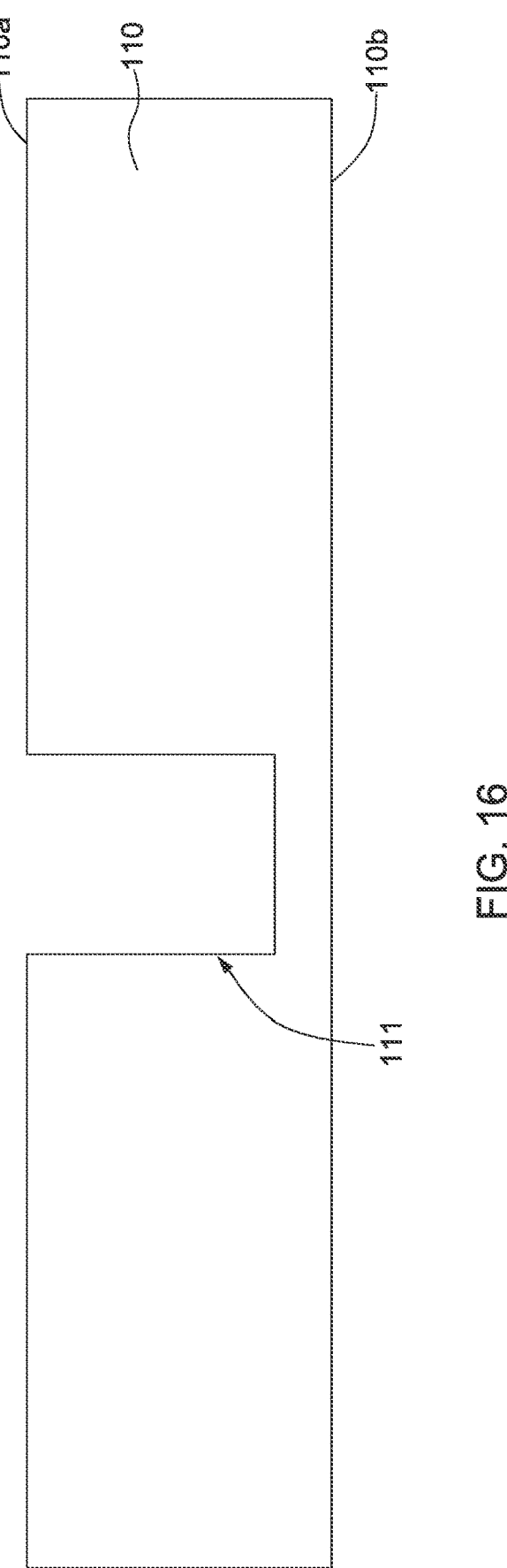
FIGS. 16 to 22 are cross-sectional views of one or more stages of the method of manufacturing a semiconductor structure in accordance with some embodiments of the present disclosure.

In operation 301, referring to FIG. 16, a recess 111 is formed on a first surface 110a of a substrate 110. In some embodiments, the recess 111 is indented into the substrate 110 and extends from the first surface 110a toward a second surface 110b of the substrate 110. In some embodiments, the recess 111 is formed by etching or any other suitable operation. The etching may be performed using acceptable photolithography techniques.

Figure 17:
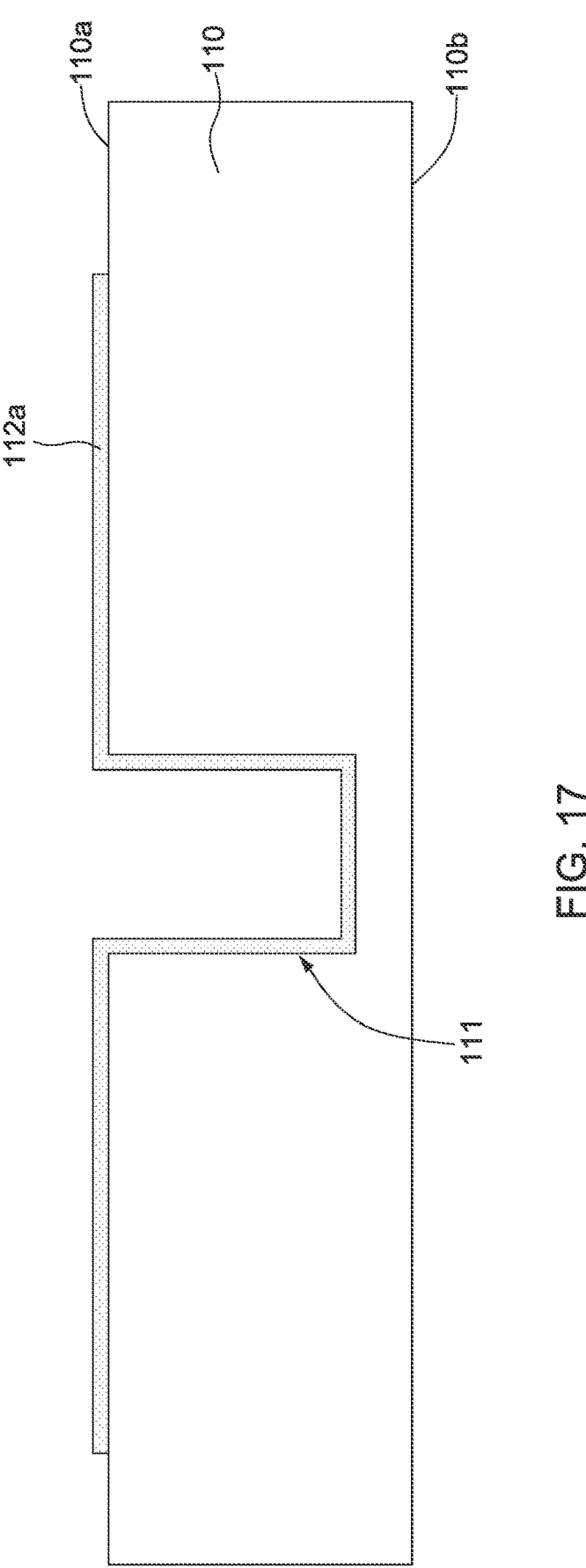

In operation 302, referring to FIG. 17, a first isolation layer 112a is disposed on the first surface 110a and extends into the recess 111. In some embodiments, the recess 111 has the first isolation layer 112a formed therein.

In some embodiments, the first isolation layer 112a is formed over the first surface 110a of the substrate 110 and in the recess 111. In some embodiments, the first isolation layer 112a is conformal to the recess 111 and a portion of the first surface 110a of the substrate 110. The first isolation layer 112a may be deposited over the surface 110a of the substrate 110 and then planarized, such as by respective CMP processes. The first isolation layer 112a may be deposited by physical vapor deposition (PVD), CVD, sputter deposition, or another technique for depositing the selected material.

Figure 18:
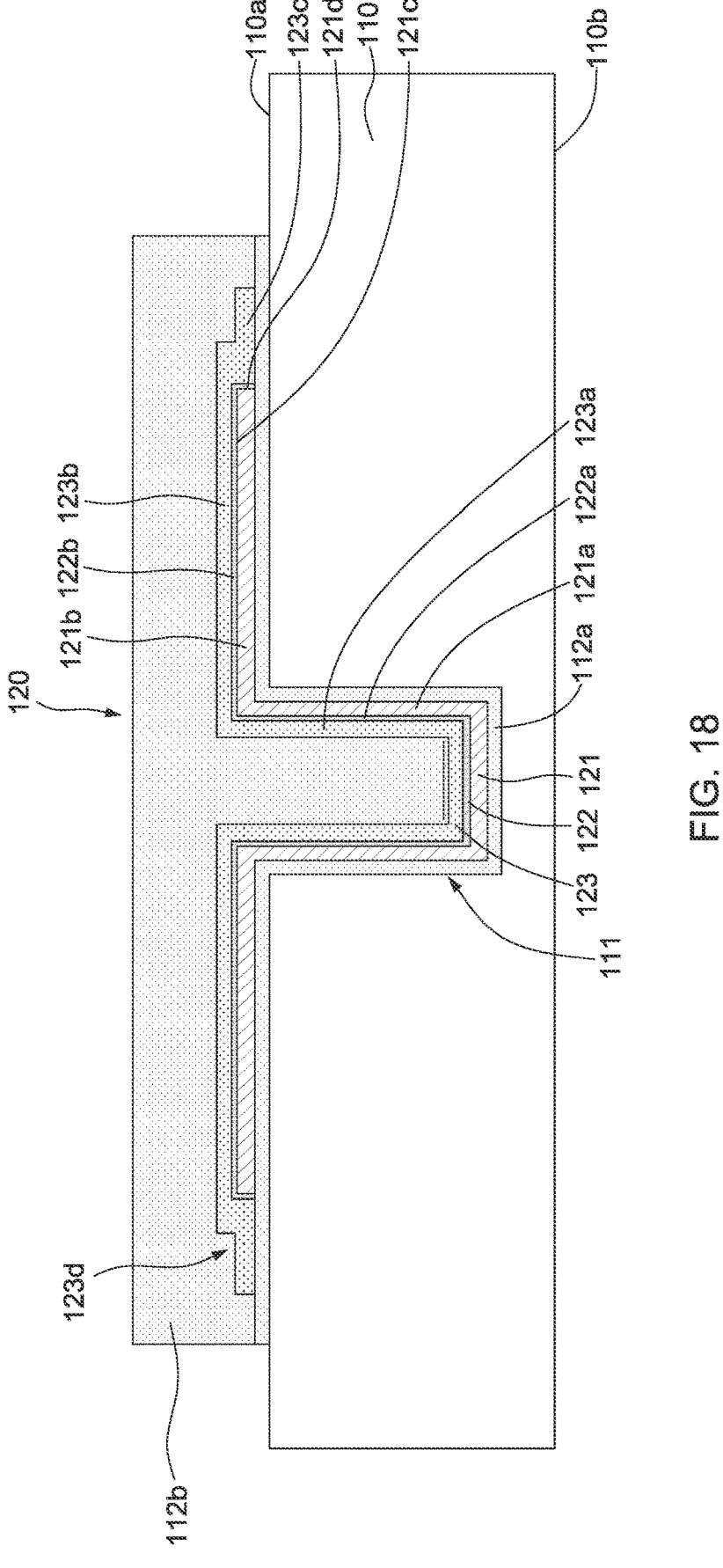

In operation 303, referring to FIG. 18, a capacitor structure 120 is formed at least partially within the recess 111. The formation of the capacitor structure 120 includes disposing a first electrode layer 121 over the first isolation layer 112a, disposing a first dielectric 122 over the first electrode layer 121, and disposing a second electrode layer 123 to cover and surround the first dielectric 122 and the first electrode layer 121. In some embodiments, the formation of the capacitor structure 120 further includes disposing a second isolation layer 112b to cover the first electrode layer 121, the first dielectric 122, and the second electrode layer 123. In some embodiments, the capacitor structure 120 is formed by sequentially disposing the first electrode layer 121, the first dielectric 122, and the second electrode layer 123.

In some embodiments, a first body portion 121a of the first electrode layer 121 is disposed in and conformal to the recess 111, and a first extending portion 121b of the first electrode layer 121 is disposed on the first isolation layer 112a and connected to the first body portion 121a. In some embodiments, the first body portion 121a and the first extending portion 121b of the first electrode layer 121 are formed continuously as a single object. The first electrode layer 121 may be deposited by PVD, CVD, sputter deposition, or another technique for depositing the selected material.

In some embodiments, the first dielectric 122 is formed over the first body portion 121a and the first extending portion 121b of the first electrode layer 121. In some embodiments, the first dielectric 122 is conformal to the first electrode layer 121. In some embodiments, at least a portion of the first dielectric 122 is in contact with the first isolation layer 112a. The second isolation layer 112b may be deposited over the first electrode layer 121. The first dielectric 122 may be deposited by PVD, CVD, sputter deposition, or another technique for depositing the dielectric material.

In some embodiments, the second electrode layer 123 is formed conformal to the first dielectric 122. In some embodiments, the second electrode layer 123 surrounds and covers the first dielectric 122 and the first electrode layer 121. In some embodiments, a second body portion 123a of the second electrode layer 123 is disposed in and conformal to the recess 111, and a second extending portion 123b of the second electrode layer 123 is disposed on the first extending portion 121b and connected to the second body portion 123a. A second protruding portion 123c of the second electrode layer 123 is formed adjacent to the first extending portion 121b and connected to the second extending portion 123b. The second electrode layer 123 may be deposited by PVD, CVD, sputter deposition, or another technique for depositing the selected material.

In some embodiments, the second body portion 123a, the second extending portion 123b and the second protruding portion 123c of the second electrode layer 123 are formed continuously as a single object. In some embodiments, at least a portion of the second electrode layer 123 is in contact with the isolation layer 112a. In some embodiments, the second protruding portion 123c is in contact with the first isolation layer 112a. The entire first electrode layer 121 is protected by the first dielectric 122 during the formation of the second electrode layer 123.

In some embodiments, the second isolation layer 112b is formed over the first isolation layer 112a. In some embodiments, at least a portion of the second isolation layer 112b is in contact with the first isolation layer 112a. In some embodiments, at least a portion of the second isolation layer 112b is formed within the recess 111.

In some embodiments, the semiconductor structure 200 is fabricated by a method 300. In some embodiments, in operation 303, the capacitor structure 120 is formed at least partially disposed within the recess 111 as shown in FIG. 8. Formation of the capacitor structure 120 of the semiconductor structure 200 shown in FIG. 8 is similar to the formation of the capacitor structure 120 of the semiconductor structure 100 shown in FIG. 18, except that the first electrode layer 121 and the first dielectric 122 are exposed by the second electrode layer 123. Formation of the capacitor structure 120 of the semiconductor structure 200 further includes forming a second dielectric 124 over the second electrode layer 123, and forming a third electrode layer 125 to cover the second electrode layer 123 and the second dielectric 124. In some embodiments, a portion of the first electrode layer 121 and a portion of the first dielectric 122 are exposed by the third electrode layer 125.

Figure 19:
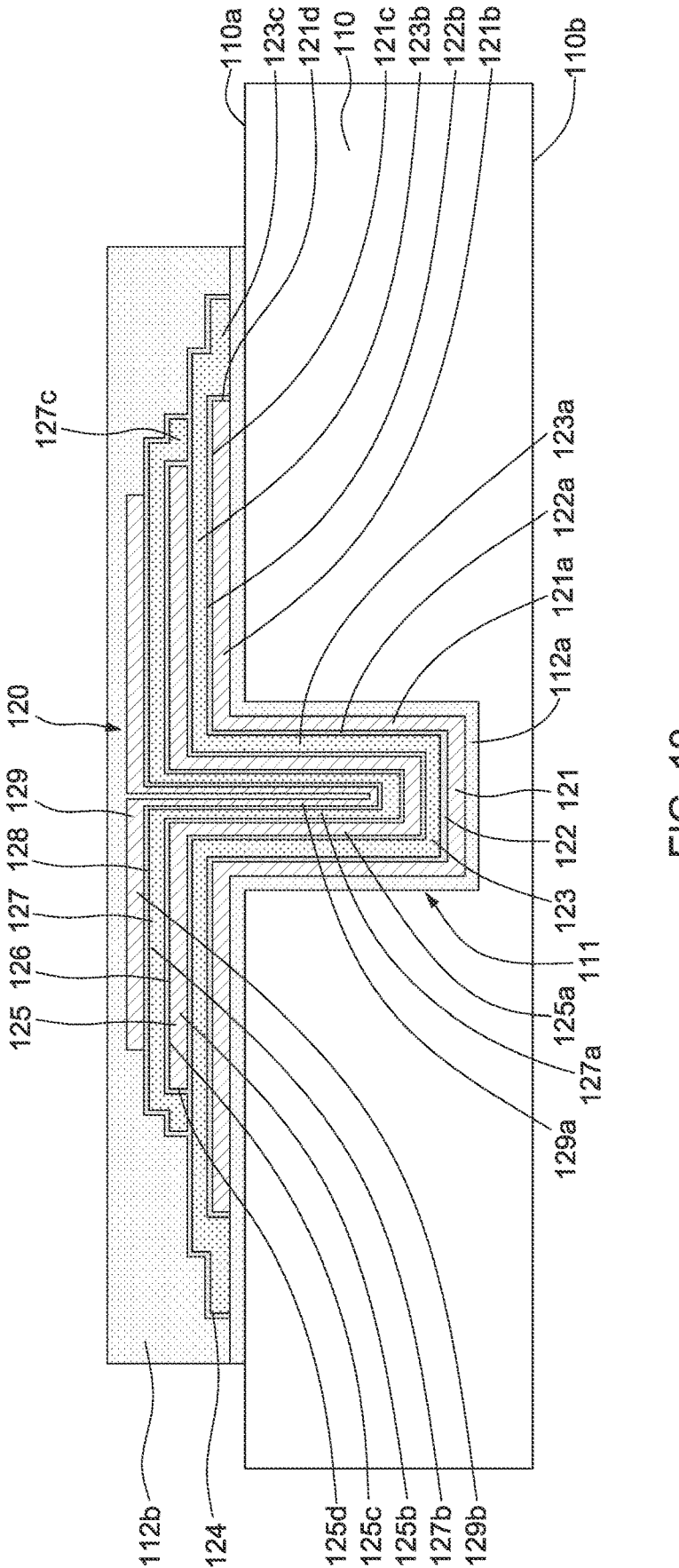
Figure 20:
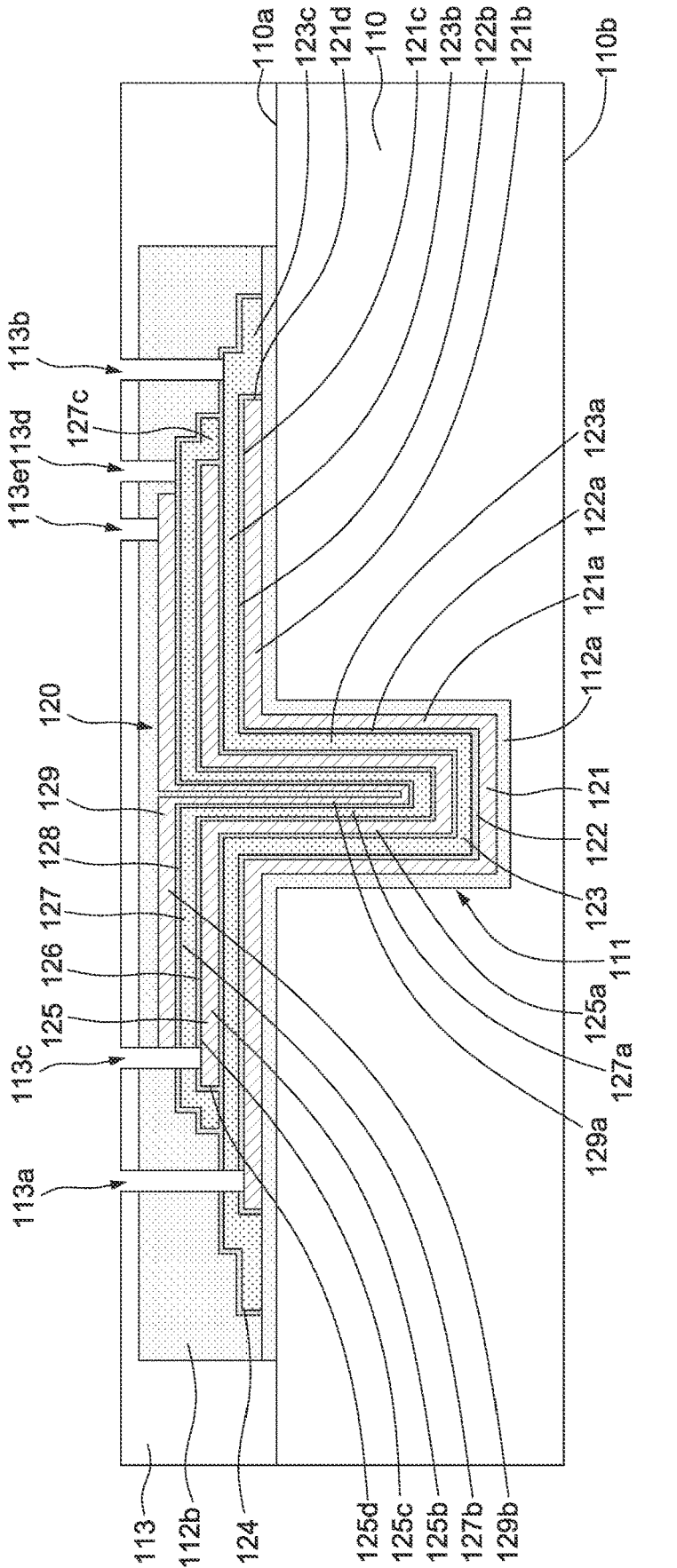

In some embodiments, referring to FIG. 19, in operation 303, formation of the capacitor structure 120 of the semiconductor structure 100 further includes forming the third electrode layer 125 over the second electrode layer 123, forming a fourth electrode layer 127 over and surrounding the third electrode layer 125, and forming a fifth electrode layer 129 over the fourth electrode layer 127. In some embodiments, formation of the capacitor structure 120 of the semiconductor structure 100 further includes forming the second dielectric 124 between the second electrode layer 123 and the third electrode layer 125, forming a third dielectric 126 between the third electrode layer 125 and the fourth electrode layer 127, and forming a fourth dielectric 128 between the fourth electrode layer 127 and the fifth electrode layer 129. In some embodiments, the second dielectric 124 is disposed over and surrounding the second electrode layer 123, the third dielectric 126 is disposed over and surrounding the third electrode layer 125, and the fourth dielectric 128 is disposed over and surrounding the fourth electrode layer 127.

In some embodiments, the capacitor structure 120 is formed by sequentially disposing the first isolation layer 112a, the first electrode layer 121, the first dielectric 122, the second electrode layer 123, the second dielectric 124, the third electrode layer 125, the third dielectric 126, the fourth electrode layer 127, the fourth dielectric 128, and the fifth electrode layer 129. In some embodiments, a portion of the fourth electrode layer 127 and a portion of the fourth dielectric 128 are exposed by the fifth electrode layer 129.

In operation 304, an interconnect structure 130 is formed and disposed over and electrically connected to the capacitor structure 120. In some embodiments, referring to FIG. 20, a first dielectric layer 113 is disposed over the substrate 110 and the capacitor structure 120. The first dielectric layer 113 is disposed over the first surface 110a of the substrate 110 and the second isolation layer 112b. In some embodiments, the first dielectric layer 113 is disposed by deposition, chemical vapor deposition (CVD) or any other suitable operation.

In some embodiments, portions of the first dielectric layer 113 are removed to form several openings extending through the first dielectric layer 113. In some embodiments, a first opening 113a, a second opening 113b, a third opening 113c, a fourth opening 113d and a fifth opening 113e are formed during the removal of the portions of the first dielectric layer 113. In some embodiments, the first electrode layer 121 is exposed through the first opening 113a, and the first opening 113a extends through the second isolation layer 112b, the second dielectric 124, the second electrode layer 123, and the first dielectric 122. In some embodiments, the second electrode layer 123 is exposed through the second opening 113b, and the second opening 113b extends through the second isolation layer 112b and the second dielectric 124. In some embodiments, the third electrode layer 125 is exposed through the third opening 113c, and the third opening 113c extends through the second isolation layer 112b, the fourth dielectric 128, the fourth electrode layer 127 and the third dielectric 126. In some embodiments, the fourth electrode layer 127 is exposed through the fourth opening 113d, and the fourth opening 113d extends through the second isolation layer 112b and the fourth dielectric 128. In some embodiments, the fifth electrode layer 129 is exposed through the fifth opening 113e, and the fifth opening 113e extends through the second isolation layer 112b.

Figure 21:
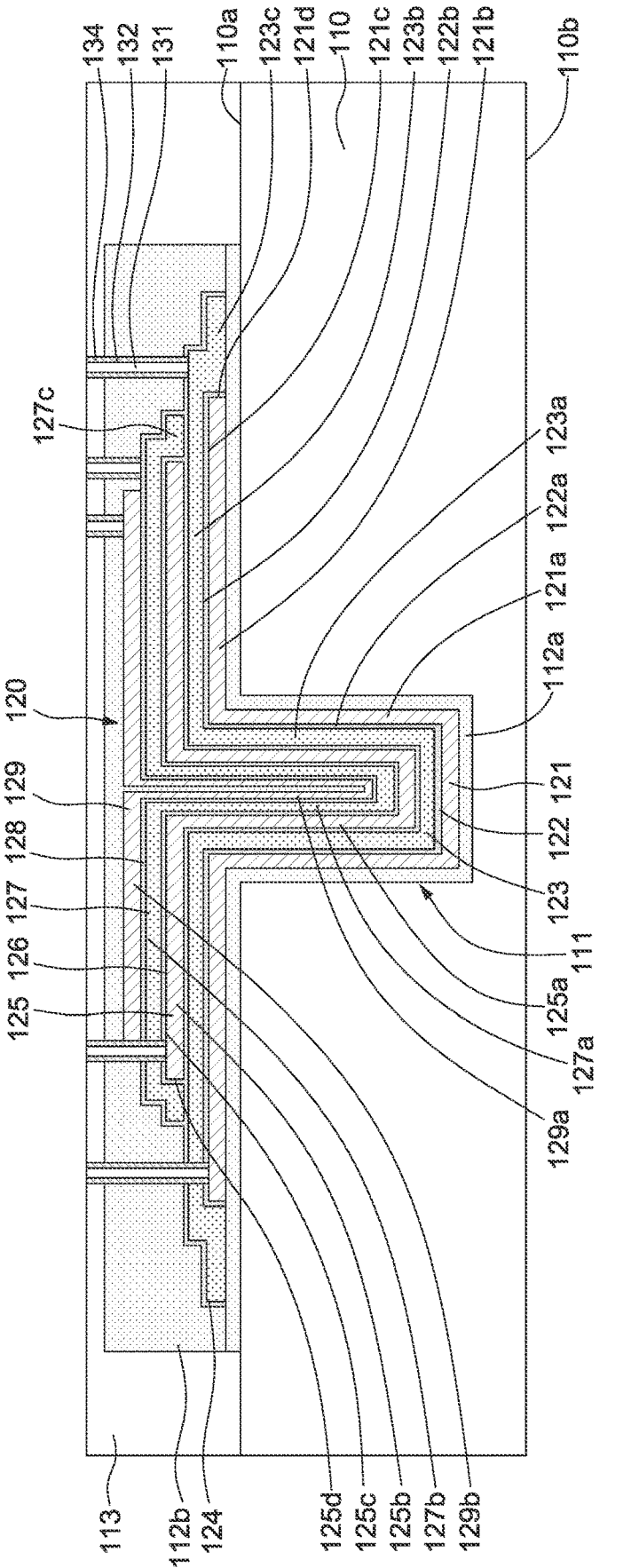

In some embodiments, referring to FIG. 21, several conductive vias 131 and third isolation layers 134 are formed within the openings respectively. In some embodiments, one of the conductive vias 131 surrounded by the corresponding one of the third isolation layers 134 is formed within each of the first opening 113a, the second opening 113b, the third opening 113c, the fourth opening 113d and the fifth opening 113e. In some embodiments, the third isolation layers 134 are formed prior to the formation of the conductive vias 131. In some embodiments, the third isolation layers 134 may be formed by PVD, CVD, sputter deposition, or another technique for depositing the selected material. In some embodiments, the conductive vias 131 are formed by electroplating, sputtering or any other suitable operation. Each of the conductive vias 131 is in contact with one of the first electrode layer 121, the second electrode layer 123, the third electrode layer 125, the fourth electrode layer 127 and the fifth electrode layer 129.

Figure 22:
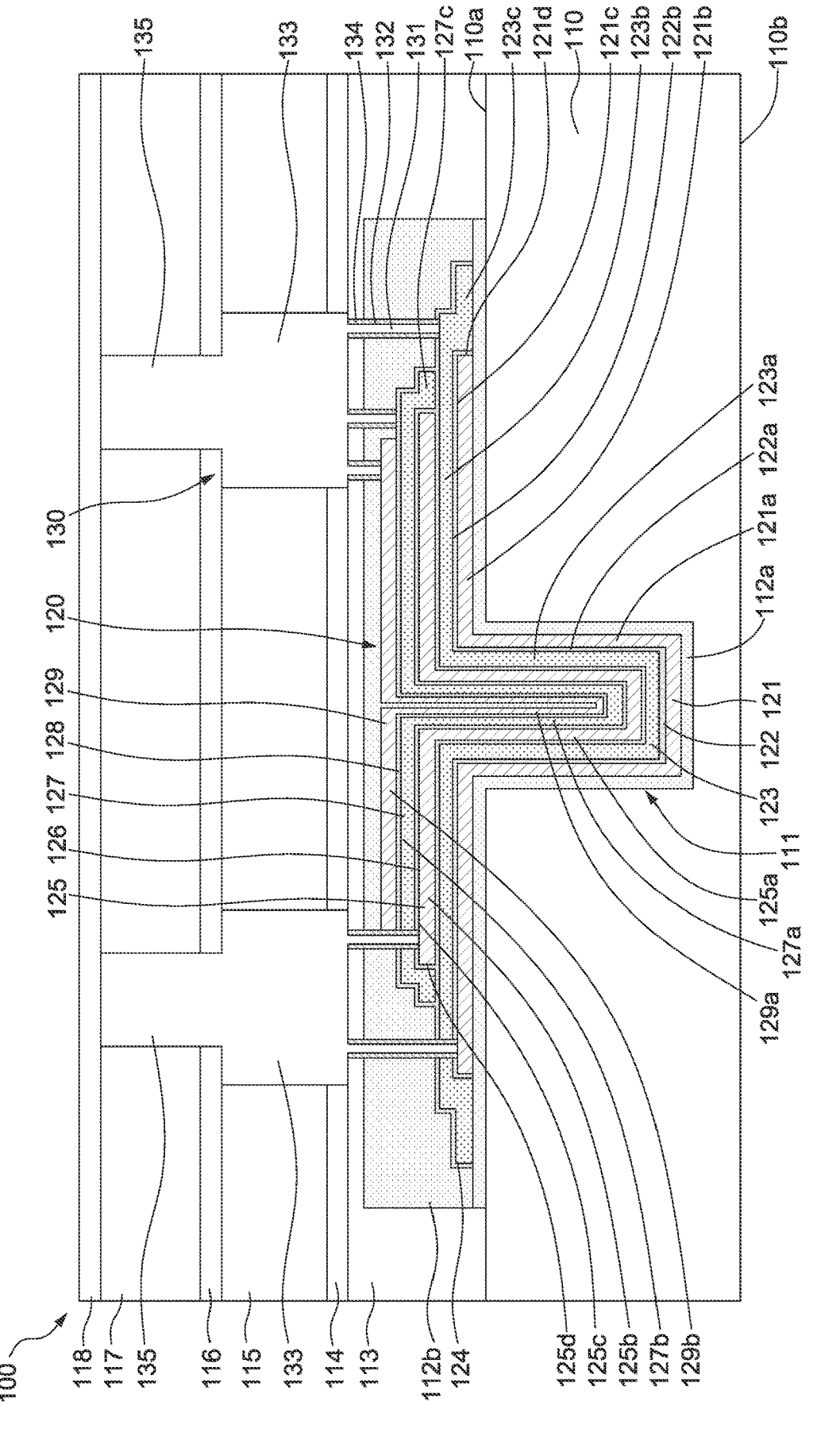

In some embodiments, referring to FIG. 22, after the formation of the conductive vias 131, a first passivation layer 114 and a second dielectric layer 115 are sequentially disposed on the first dielectric layer 113. The first passivation layer 114 covers the conductive vias 131, the third isolation layer 134 and the first dielectric layer 113. After the disposing of the first passivation layer 114 and the second dielectric layer 115, portions of the first passivation layer 114 and the second dielectric layer 115 are removed, whereby the conductive vias 131 are exposed through the first passivation layer 114 and the second dielectric layer 115. Subsequently, several conductive members 133 are formed and surrounded by the first passivation layer 114 and the second dielectric layer 115. The conductive member 133 is in contact with the conductive via 131. In some embodiments, the conductive member 133 is electrically connected to the capacitor structure 120 through the conductive via 131.

After the formation of the conductive member 133, a second passivation layer 116 is disposed over the conductive member 133 and the second dielectric layer 115. In some embodiments, several dielectric layers and several passivation layers are alternately and sequentially disposed. In some embodiments, several conductive vias and several conductive members are sequentially formed within the dielectric layers and the passivation layers. In some embodiments, a last passivation layer 117 and a last dielectric layer 118 are sequentially disposed on the second passivation layer 116, and a last conductive via 135 is formed within the second passivation layer 116 and the last passivation layer 117. In some embodiments, the semiconductor structure 100 is formed as shown in FIG. 22.

One aspect of this disclosure relates to a semiconductor structure. The semiconductor structure includes a substrate including a recess indented into the substrate, a capacitor structure at least partially disposed within the recess, and an interconnect structure disposed over and electrically connected to the capacitor structure. The capacitor structure includes a first electrode layer, a second electrode layer over the first electrode layer, and a first dielectric between the first electrode layer and the second electrode layer. The first electrode layer includes a first body portion disposed in and conformal to the recess and a first extending portion disposed on the substrate, and the second electrode layer covers the first dielectric, the first body portion and the first extending portion of the first electrode layer.

In some embodiments, the semiconductor structure further includes an isolation layer disposed between the first electrode layer and the substrate, wherein the first electrode layer is enclosed by the first dielectric and the isolation layer. In some embodiments, the first electrode layer and the first dielectric are enclosed by the second electrode layer and the isolation layer. In some embodiments, the first extending portion of the first electrode layer includes a top surface and a sidewall, the second electrode layer includes a second body portion, a second extending portion and a second protruding portion, the second body portion is disposed in the recess and over the first body portion of the first electrode layer, the second extending portion is disposed over the top surface of the first extending portion of the first electrode layer, and the second protruding portion surrounds the sidewall of the first extending portion of the first electrode layer. In some embodiments, the second body portion, the second extending portion, and the second protruding portion of the second electrode layer are integral and continuous. In some embodiments, the second extending portion and the second protruding portion of the second electrode layer form a step structure. In some embodiments, the capacitor structure further includes a third electrode layer disposed over the second electrode layer, and a second dielectric between the second electrode layer and the third electrode layer. In some embodiments, the third electrode layer includes a third extending portion disposed over the second extending portion of the second electrode layer, and at least a portion of the second extending portion is exposed by the third extending portion of the third electrode layer. In some embodiments, the capacitor structure further includes a fourth electrode layer having a fourth extending portion and a fourth protruding portion, the fourth extending portion is disposed over the third extending portion of the third electrode layer, and the fourth protruding portion is disposed over at least a portion of the second extending portion of the second electrode layer and adjacent to the third extending portion of the third electrode layer. In some embodiments, the capacitor structure further includes a fourth electrode layer having a fourth extending portion, a fourth protruding portion and a fifth protruding portion, the fourth extending portion is disposed over the third extending portion of the third electrode layer, the fourth protruding portion is disposed over a portion of the second extending portion of the second electrode layer and adjacent to the third extending portion of the third electrode layer, and the fifth protruding portion is disposed over at least a portion of the second protruding portion of the second electrode layer and adjacent to the second extending portion of the third electrode layer.

One aspect of this disclosure relates to a semiconductor structure. The semiconductor structure includes a substrate including a recess indented into the substrate, a capacitor structure at least partially disposed within and conformal to the recess, and an interconnect structure disposed over and electrically connected to the capacitor structure. The capacitor structure includes a first electrode layer, a second electrode layer over the first electrode layer, and a third electrode layer disposed over the second electrode layer and the first electrode layer, wherein the second electrode layer is enclosed by the first electrode layer and the third electrode layer.

In some embodiments, the third electrode layer includes an extending portion disposed over the second electrode layer and a protruding portion surrounding a sidewall of the second electrode layer, wherein the extending portion and the protruding portion of the third electrode layer are integral and continuous. In some embodiments, the protruding portion of the third electrode layer has an L shape. In some embodiments, the first electrode layer includes a first body portion disposed in the recess and a first extending portion disposed on the substrate; the second electrode layer includes a second body portion disposed over the first body portion of the first electrode layer and a second extending portion disposed over a portion of the first extending portion of the first electrode layer; and the third electrode layer includes a third extending portion disposed over a top surface of the second electrode layer and a third protruding portion disposed adjacent to a sidewall of the second electrode layer. In some embodiments, the third electrode layer further includes a fourth protruding portion connected to the third protruding portion and disposed adjacent to a sidewall of the first extending portion of the first electrode layer, wherein the third extending portion, the third protruding portion and the fourth protruding portion of the third electrode layer are integral and continuous. In some embodiments, the capacitor structure further includes a fourth electrode layer disposed over the third electrode layer, and a fifth electrode layer disposed over and surrounding the fourth electrode layer, wherein the fourth electrode layer is enclosed by the third electrode layer and the fifth electrode layer.

An aspect of this disclosure relates to a method of manufacturing a semiconductor structure. The method includes forming a recess on a surface of a substrate; disposing an isolation layer on the surface and extending into the recess; forming a capacitor structure at least partially disposed within the recess; and forming an interconnect structure disposed over and electrically connected to the capacitor structure. The formation of the capacitor structure includes disposing a first electrode layer over the isolation layer; disposing a first dielectric over the first electrode layer; and disposing a second electrode layer to cover and surround the first dielectric and the first electrode layer.

In some embodiments, at least a portion of the second electrode layer is in contact with the isolation layer. In some embodiments, the method further includes forming a third electrode layer between the isolation layer and the capacitor structure, wherein at least a portion of the third electrode layer is exposed through the capacitor structure. In some embodiments, the method further includes forming a third electrode layer over the second electrode layer; and forming a fourth electrode layer over and surrounding the third electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a substrate including a recess indented into the substrate;

a capacitor structure at least partially disposed within the recess, an interconnect structure disposed over and electrically connected to the capacitor structure, and an isolation layer, wherein the capacitor structure includes a first electrode layer, a second electrode layer over the first electrode layer, and a first dielectric between the first electrode layer and the second electrode layer, the first electrode layer includes a first body portion disposed in and conformal to the recess and a first extending portion disposed on the substrate, and the second electrode layer covers the first dielectric, the first body portion and the first extending portion of the first electrode layer, wherein the isolation layer is disposed between the first electrode layer and the substrate, and wherein the first electrode layer is enclosed by the first dielectric and the isolation layer.

2. The semiconductor structure of claim 1, wherein the first electrode layer and the first dielectric are enclosed by the second electrode layer and the isolation layer.

3. The semiconductor structure of claim 1, wherein the first extending portion of the first electrode layer includes a top surface and a sidewall, the second electrode layer includes a second body portion, a second extending portion and a second protruding portion, the second body portion is disposed in the recess and over the first body portion of the first electrode layer, the second extending portion is disposed over the top surface of the first extending portion of the first electrode layer, and the second protruding portion surrounds the sidewall of the first extending portion of the first electrode layer.

4. The semiconductor structure of claim 3, wherein the second body portion, the second extending portion, and the second protruding portion of the second electrode layer are integral and continuous.

5. The semiconductor structure of claim 3, wherein the second extending portion and the second protruding portion of the second electrode layer form a step structure.

6. The semiconductor structure of claim 3, wherein the capacitor structure further includes a third electrode layer disposed over the second electrode layer, and a second dielectric between the second electrode layer and the third electrode layer.

7. The semiconductor structure of claim 6, wherein the third electrode layer includes a third extending portion disposed over the second extending portion of the second electrode layer, and at least a portion of the second extending portion is exposed from the third extending portion of the third electrode layer.

8. The semiconductor structure of claim 7, wherein the capacitor structure further includes a fourth electrode layer having a fourth extending portion and a fourth protruding portion, the fourth extending portion is disposed over the third extending portion of the third electrode layer, and the fourth protruding portion is disposed over at least a portion of the second extending portion of the second electrode layer and adjacent to the third extending portion of the third electrode layer.

9. The semiconductor structure of claim 3, wherein the second protruding portion of the second electrode layer is in contact with the isolation layer.

10. The semiconductor structure of claim 1, wherein at least a portion of the first dielectric is in contact with the isolation layer.

11. A method of manufacturing a semiconductor structure, comprising:

forming a recess on a surface of a substrate;

disposing an isolation layer on the surface and extending into the recess;

forming a capacitor structure at least partially disposed within the recess, wherein the formation of the capacitor structure includes:

disposing a first electrode layer over the isolation layer;

disposing a first dielectric over the first electrode layer; and disposing a second electrode layer to cover and surround the first dielectric and the first electrode layer; and forming an interconnect structure disposed over and electrically connected to the capacitor structure.

12. The method of claim 11, wherein at least a portion of the second electrode layer is in contact with the isolation layer.

13. The method of claim 11, further comprising:

forming a third electrode layer between the isolation layer and the capacitor structure, wherein at least a portion of the third electrode layer is exposed through the capacitor structure.

14. The method of claim 11, further comprising:

forming a third electrode layer over the second electrode layer; and forming a fourth electrode layer over and surrounding the third electrode layer.

15. A semiconductor structure, comprising:

a substrate including a recess indented into the substrate;

a capacitor structure at least partially disposed within and conformal to the recess, and an interconnect structure disposed over and electrically connected to the capacitor structure, and an isolation layer, wherein the capacitor structure includes a first electrode layer, a second electrode layer over the first electrode layer, and a third electrode layer disposed over the second electrode layer and the first electrode layer, wherein the first electrode layer and the second electrode layer are separated by a first dielectric, and the second electrode layer and the third electrode layer are separated by a second dielectric, wherein the isolation layer is disposed between the first electrode layer and the substrate, and wherein the first electrode layer is enclosed by the first dielectric and the isolation layer.

16. The semiconductor structure of claim 15, wherein the third electrode layer includes an extending portion disposed over the second electrode layer and a protruding portion surrounding a sidewall of the second electrode layer, and the extending portion and the protruding portion of the third electrode layer are integral and continuous.

17. The semiconductor structure of claim 16, wherein the protruding portion of the third electrode layer has an L shape.

18. The semiconductor structure of claim 15, wherein the first electrode layer includes a first body portion disposed in the recess and a first extending portion disposed on the substrate, the second electrode layer includes a second body portion disposed over the first body portion of the first electrode layer and a second extending portion disposed over a portion of the first extending portion of the first electrode layer; and the third electrode layer includes a third extending portion disposed over a top surface of the second electrode layer and a third protruding portion disposed adjacent to a sidewall of the second electrode layer.

19. The semiconductor structure of claim 18, wherein the third electrode layer further includes a fourth protruding portion connected to the third protruding portion and disposed adjacent to a sidewall of the first extending portion of the first electrode layer, and the third extending portion, the third protruding portion and the fourth protruding portion of the third electrode layer are integral and continuous.

20. The semiconductor structure of claim 15, wherein the capacitor structure further includes a fourth electrode layer disposed over the third electrode layer, and a fifth electrode layer disposed over and surrounding the fourth electrode layer, wherein the fourth electrode layer is enclosed by the third electrode layer and the fifth electrode layer.

* * * * *